(12) United States Patent
Tsutsui

(10) Patent No.: US 10,310,173 B2
(45) Date of Patent: Jun. 4, 2019

(54) LIGHTING DEVICE AND DISPLAY DEVICE

(71) Applicant: SHARP KABUSHIKI KAISHA, Sakai, Osaka (JP)

(72) Inventor: Hiromitsu Tsutsui, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/574,100

(22) PCT Filed: May 12, 2016

(86) PCT No.: PCT/JP2016/064091
§ 371 (c)(1),
(2) Date: Nov. 14, 2017

(87) PCT Pub. No.: WO2016/185990
PCT Pub. Date: Nov. 24, 2016

(65) Prior Publication Data
US 2018/0217313 A1    Aug. 2, 2018

(30) Foreign Application Priority Data

May 18, 2015  (JP) ................................ 2015-100970

(51) Int. Cl.
*F21V 8/00*      (2006.01)
*G02F 1/1335*    (2006.01)
*G02F 1/1333*    (2006.01)

(52) U.S. Cl.
CPC ........... *G02B 6/009* (2013.01); *G02B 6/0023* (2013.01); *G02B 6/0083* (2013.01);
(Continued)

(58) Field of Classification Search
CPC .... G02B 6/009; G02B 6/0091; G02B 6/0023; G02B 6/0083; G02F 1/133615;
(Continued)

(56) References Cited

U.S. PATENT DOCUMENTS 8,033,708 B2   10/2011   Tsubaki
8,342,730 B2   1/2013    Tsubaki
(Continued)

FOREIGN PATENT DOCUMENTS

JP     2001-052516 A    2/2001
JP     2009-224301 A    10/2009
(Continued)

*Primary Examiner* — Anh T Mai
*Assistant Examiner* — Glenn D Zimmerman
(74) *Attorney, Agent, or Firm* — ScienBiziP, P.C.

(57) ABSTRACT

A backlight device includes LEDs, a unit body holding the LEDs, a light guide plate having a light entrance edge surface and a light exit plate surface, and a chassis. The light entrance edge surface is a part of outer peripheral edge surfaces of the light guide plate and extends in a peripheral direction and light from the LEDs enters through the light entrance edge surface. The light exit plate surface is one of plate surfaces of the light guide plate and light exits through the light exit plate surface. The LEDs and the light guide plate are arranged in the chassis and the chassis has a fitting hole that is open in a direction crossing an extending direction of the light entrance edge surface such that the LEDs are inserted in and removed from the fitting hole according to mounting and detaching of the unit body.

11 Claims, 16 Drawing Sheets

(52) U.S. Cl.
CPC ......... *G02B 6/0088* (2013.01); *G02B 6/0091* (2013.01); *G02F 1/133615* (2013.01); *G02F 1/133308* (2013.01); *G02F 2001/133314* (2013.01); *H05K 2201/10106* (2013.01); *H05K 2201/2018* (2013.01)

(58) Field of Classification Search
CPC ............. G02F 1/1333; G02F 1/133308; G02F 2001/133314; H05K 2201/10106; H05K 2201/2018
See application file for complete search history.

(56) References Cited

U.S. PATENT DOCUMENTS

| | | | |
|---|---|---|---|
| 8,517,590 B2 | 8/2013 | Tajiri et al. | |
| 8,827,494 B2 | 9/2014 | Bergeron | |
| 2006/0221641 A1* | 10/2006 | Yoon | G02B 6/0068 362/623 |
| 2008/0074580 A1* | 3/2008 | Chang | G02B 6/0068 349/65 |
| 2009/0237957 A1 | 9/2009 | Tsubaki | |
| 2010/0123847 A1* | 5/2010 | Jeong | G02B 6/0091 349/58 |
| 2011/0273904 A1* | 11/2011 | Tajiri | F21V 29/004 362/606 |
| 2012/0062816 A1 | 3/2012 | Tsubaki | |
| 2012/0300462 A1 | 11/2012 | Bergeron | |
| 2013/0083559 A1* | 4/2013 | Oh | G02B 6/0088 362/612 |

FOREIGN PATENT DOCUMENTS

| | | |
|---|---|---|
| JP | 2010-027513 A | 2/2010 |
| JP | 2011-238367 A | 11/2011 |
| JP | 2011-253624 A | 12/2011 |
| JP | 2013-516728 A | 5/2013 |
| JP | 2014-199819 A | 10/2014 |
| JP | 2015-032461 A | 2/2015 |

* cited by examiner

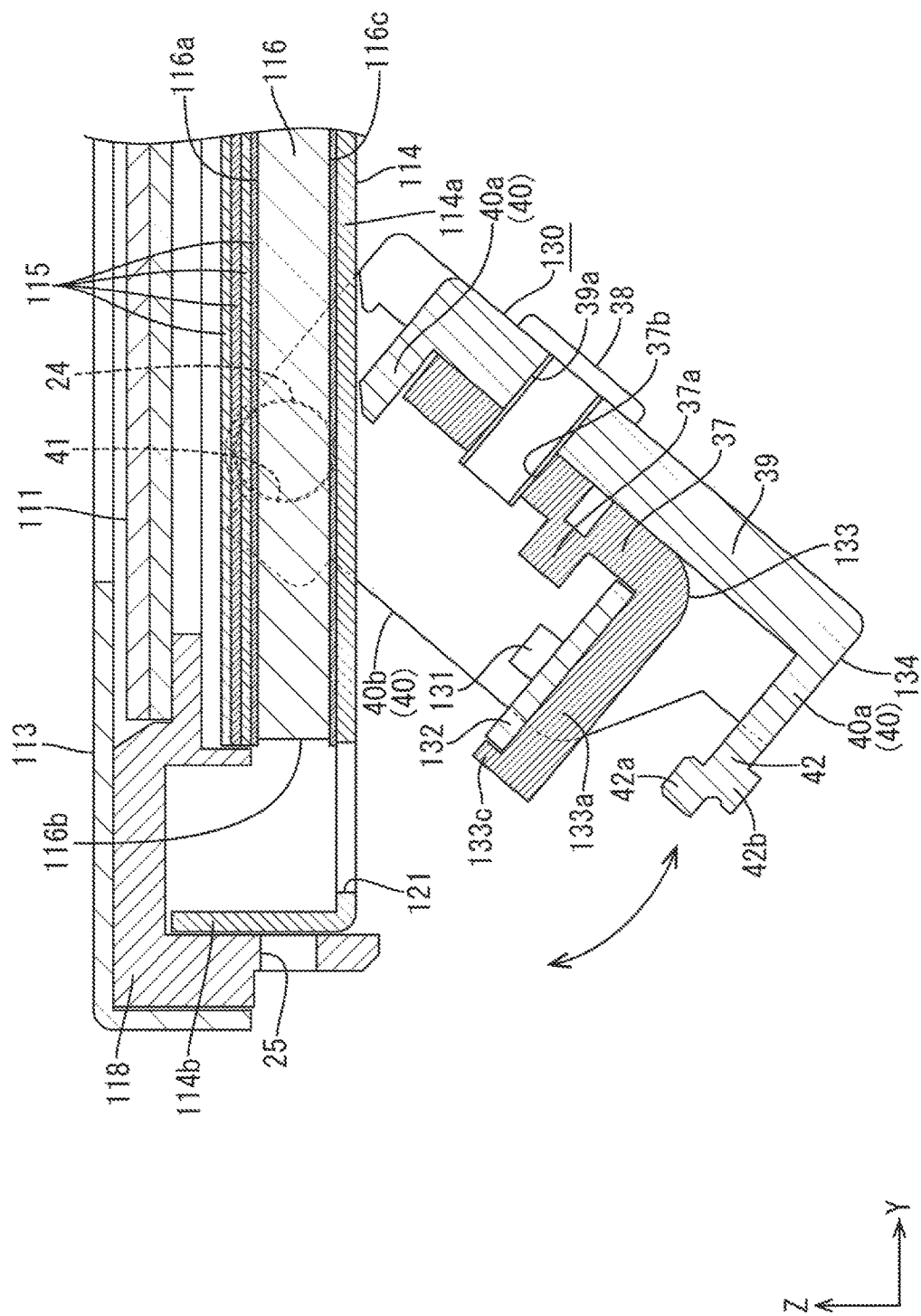

LIGHTING DEVICE AND DISPLAY DEVICE

TECHNICAL FIELD

The present invention relates to a lighting device and a display device.

BACKGROUND ART

A liquid crystal display device includes a liquid crystal panel as a display panel and the liquid crystal panel does not emit light. Therefore, the liquid crystal display device necessarily includes a lighting device and an example of such a lighting device is described in Patent Document 1. The lighting device described in Patent Document 1 includes a light guide plate, a light source unit including LEDs as a light source, and a casing in which the light guide plate and the light source unit are arranged. The light source unit is detachably mounted in the casing with a sliding mechanism that enables the light source unit to slide along an edge surface of the light guide plate. In assembling the lighting device, the light source unit is slid along the casing and inserted therein while keeping a clearance between the light guide plate and the LEDs with a spacer. Then, a pressure member that presses the light source unit toward the light guide plate is arranged between the light source unit and the casing to keep the clearance between the light guide plate and the LEDs appropriately.

RELATED ART DOCUMENT

Patent Document

Patent Document 1: Japanese Unexamined Patent Publication No. 2009-224301

DISCLOSURE OF THE PRESENT INVENTION

Problem to be Solved by the Invention

In the lighting device described in Patent Document 1, the LED unit is slid in an extending direction of the edge surface of the light guide plate with the sliding mechanism such that the LED unit is mounted in and detached from the casing. Therefore, dust is likely to be produced according to the sliding. If the dust produced by the sliding remains within the casing and adheres to any optical components in the lighting device, display quality may be deteriorated. Working efficiency of sliding the LED unit in the extending direction of the edge surface of the light guide plate is low and cost for replacement of the LEDs is likely to be increased.

One object of the present invention is to provide a technology for achieving less production of dust and improving working efficiency.

Means for Solving the Problem

A lighting device according to the present invention includes a light source, a light source holding member holding the light source, a light guide plate having a light entrance edge surface and a light exit plate surface, the light entrance edge surface being a part of outer peripheral edge surfaces of the light guide plate and extending in a peripheral direction and through which light from the light source enters, and the light exit plate surface being one of a pair of plate surfaces of the light guide plate and through which light exits, and a casing in which the light source and the light guide plate are arranged and the light source holding member is detachably mounted, the casing having a hole that is open in a direction crossing an extending direction in which the light entrance edge surface extends such that the light source is inserted in and removed from the hole according to mounting and detaching of the light source holding member.

According to such a configuration, the light rays emitted by the light source enter the light guide plate through the light entrance edge surface and travel within the light guide plate and exit through the light exit plate surface. The light source holding member holding the light source is detachably mounted in the casing and the moving direction of the light source holding member in the mounting and detaching is same as the direction in which the hole opens. The light source is inserted in and removed from the hole of the casing according to the mounting and detaching of the light source holding member. In the casing, the hole opens in a direction crossing the extending direction of the light entrance edge surface of the light guide plate. Therefore, the light source holding member is less likely to be rubbed on the casing in the mounting and detaching of the light source holding member compared to a structure in that the hole opens in the extending direction of the light entrance edge surface. Accordingly, dust is less likely to be produced according to the mounting and detaching of the light source holding member and the workability of mounting and detaching of the light source holding member is improved.

The following configurations are preferable embodiments.

(1) The casing may include at least a side wall portion that is opposite the light entrance edge surface of the light guide plate, and the side wall portion may have the hole. According to such a configuration, the hole which the light source is inserted in and removed from according to the mounting and detaching of the light source holding member is formed in the side wall portion of the casing and therefore, the light source holding member that is mounted in the casing is arranged to overlap the casing with respect to the normal line to the light entrance edge surface. Accordingly, the lighting device is preferably maintained to be thin.

(2) The lighting device may further include a light transmissive dustproof member that is disposed to cover the hole of the casing and through which the light from the light source passes. According to such a configuration, the hole is covered with the light transmissive dustproof member and dust is less likely to enter the casing from the outside through the hole. The light rays from the light source can transmit through the light transmissive dustproof member although the light transmissive dustproof member is between the light source and the light entrance edge surface of the light guide plate. Therefore, the light transmissive dustproof member is less likely to hinder entrance of light through the light entrance edge surface of the light guide plate.

(3) The casing may include at least a bottom portion that supports a plate surface of the light guide plate opposite from the light exit plate surface and the bottom portion may have the hole. According to such a configuration, the hole is formed in the bottom portion of the casing. Therefore, even if light leaks through the hole of the casing, the leaking light is less likely to be seen from the light exit side of the light guide plate and light leaking is less likely to be recognized.

(4) One of the light source holding member and the casing may include a magnetic portion, and another one of the light source holding member and the casing may include a magnet on at least a part thereof, and the magnet may be attached to the magnetic portion. According to such a configuration, the magnet sticks to the magnetic member such that the light source holding member is held by the casing. Therefore, the light source holding member is mounted in and detached from the casing easily and workability is good.

(5) The magnet may be arranged next to the light source and on an outer side with respect to the light source in the extending direction. According to such a configuration, the lighting device can be maintained to be thin and keep a sufficient sticking area where the magnet sticks compared to a structure in which the magnet is arranged on an outer side with respect to the light source and next to the light source in the direction of the normal line to the light entrance edge surface and in the direction perpendicular to the extending direction.

(6) One of the light source holding member and the casing may include a positioning projection that projects toward another one of the light source holding member and the casing in a direction of a normal line to the light entrance edge surface, and the other one of the light source holding member and the casing may include a positioning hole that receives the positioning projection. According to such a configuration, when the light source holding member is mounted in the casing, the positioning projection is inserted in the positioning hole such that the light source holding member is positioned in the casing with respect to the direction crossing the normal line to the light entrance edge surface. Accordingly, the light source holding member is mounted in the casing easily and the light source is less likely to hit the edge of the hole during the mounting of the light source holding member.

(7) The light source holding member may include the positioning projection and the positioning projection may have a projected distal end that projects further than the light source. According to such a configuration, when the light source holding member is mounted in the casing, the light source is inserted into the hole after the positioning projection is inserted in the positioning hole. Therefore, the light source is further less likely to hit the edge of the hole during the mounting of the light source holding member.

(8) One of the light source holding member and the casing may include a stopper portion that is deformable with warping, and another one of the light source holding member and the casing may include a stopping portion which the stopper portion is stopped by. According to such a configuration, the stopper portion that is deformable with warping is stopped by the stopping portion such that the light source holding member is held with the casing. Therefore, holding of the light source holding member can be maintained more surely than a configuration in that holding of the light source holding member is maintained with a magnet. When the light source holding member is detached from the casing, the stopper portion is deformed with warping such that the stopping state of the stopper portion and the stopping portion can be released easily and workability of mounting and detaching of the light source holding member is effectively ensured.

(9) One of the light source holding member and the casing may include a rotation shaft, and another one of the light source holding member and the casing may include a bearing recess portion. According to such a configuration, the light source holding member is rotated with respect to the casing such that the light source included in the light source holding member is inserted in and removed from the hole of the casing. The rotation shaft is pivotally supported by the bearing recess such that the light source holding member is rotatable with respect to the casing. Therefore, the operation such as replacement of the light source can be performed without detaching the light source holding member completely from the casing. Therefore, the light source holding member is less likely to be lost.

(10) The rotation shaft may have a rotation axis that is parallel to the extending direction. According to such a configuration, the light source holding member is rotated in the direction crossing the extending direction of the light entrance edge surface with respect to the casing. Therefore, the rotation range of the light source holding member can be kept constant regardless of the arrangement area of the light source with respect to the extending direction of the light entrance edge surface. Therefore, an operation space required for the rotation of the light source holding member with respect to the casing is reduced and workability is further improved.

Next, to solve the above problem, a display device of the present invention includes the lighting device and a display panel displaying images using light from the lighting device. According to the display device having such a configuration, dust is less likely to be produced according to the mounting and detaching of the light source holding member in the lighting device and workability of the mounting and detaching of the light source holding member is improved. Therefore, display with excellent display quality can be achieved and workability of maintenance operations is improved.

Advantageous Effect of the Invention

According to the present invention, dust is less likely to be produced and working efficiency is improved.

BRIEF DESCRIPTION OF THE DRAWINGS

FIG. 16 is a cross-sectional view illustrating the liquid crystal display device from which the LED unit is removed and taken in the short-side direction.

MODE FOR CARRYING OUT THE INVENTION

First Embodiment

Figure 7:
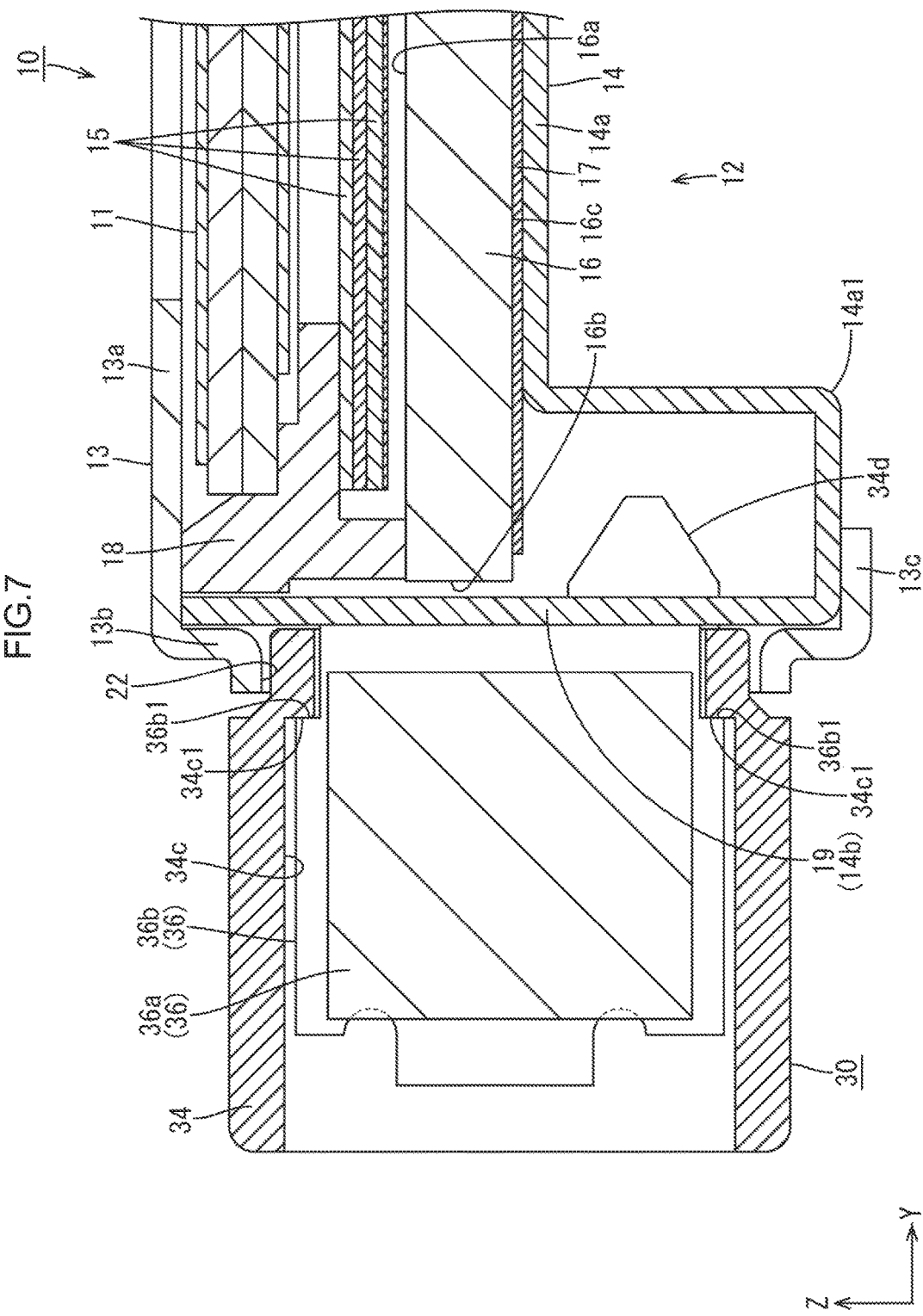
FIG. 7 is a cross-sectional view taken along line vii-vii in FIG. 6.
Figure 8:
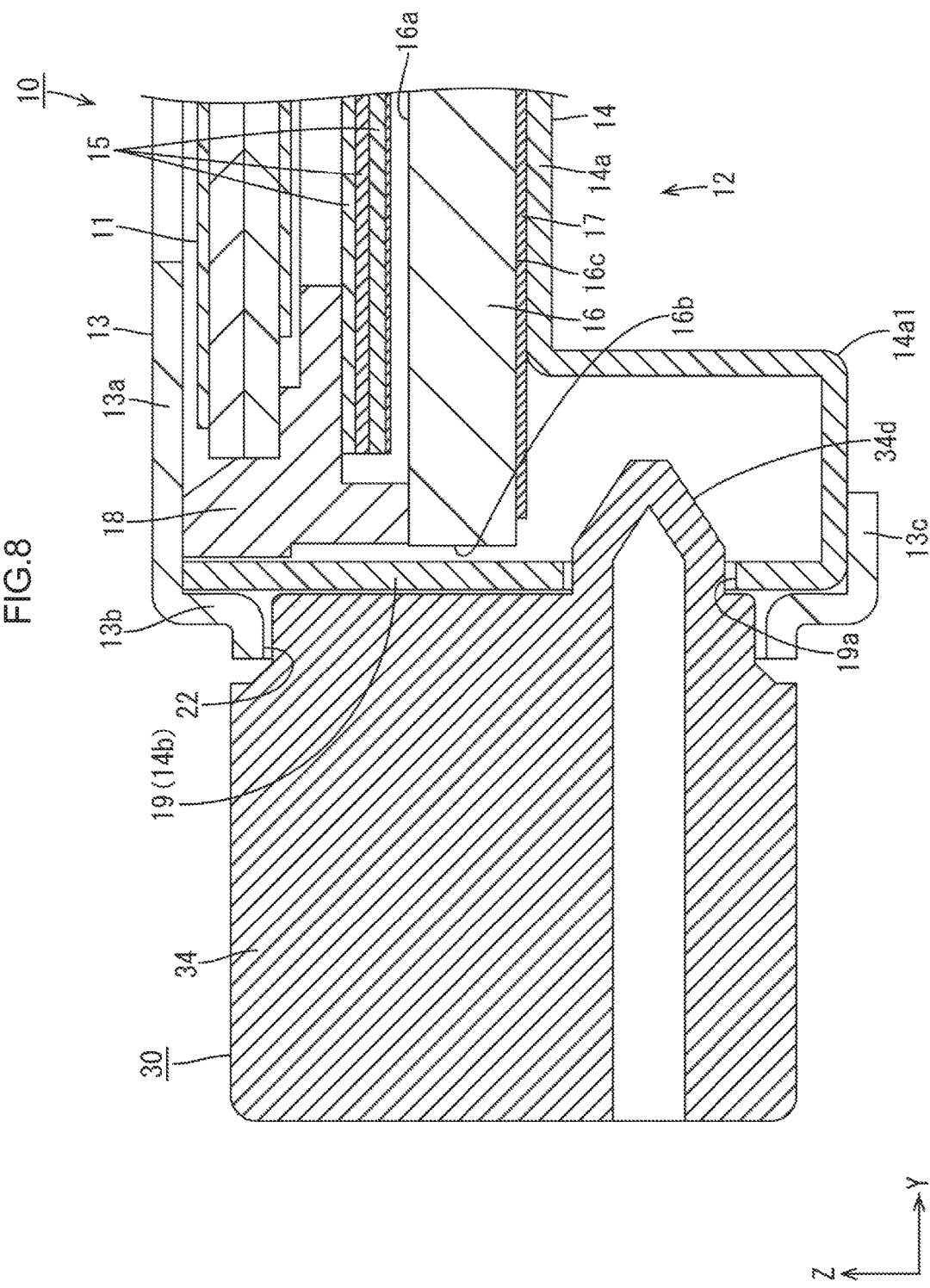
FIG. 8 is a cross-sectional view taken along line viii-viii in FIG. 6.
Figure 9:
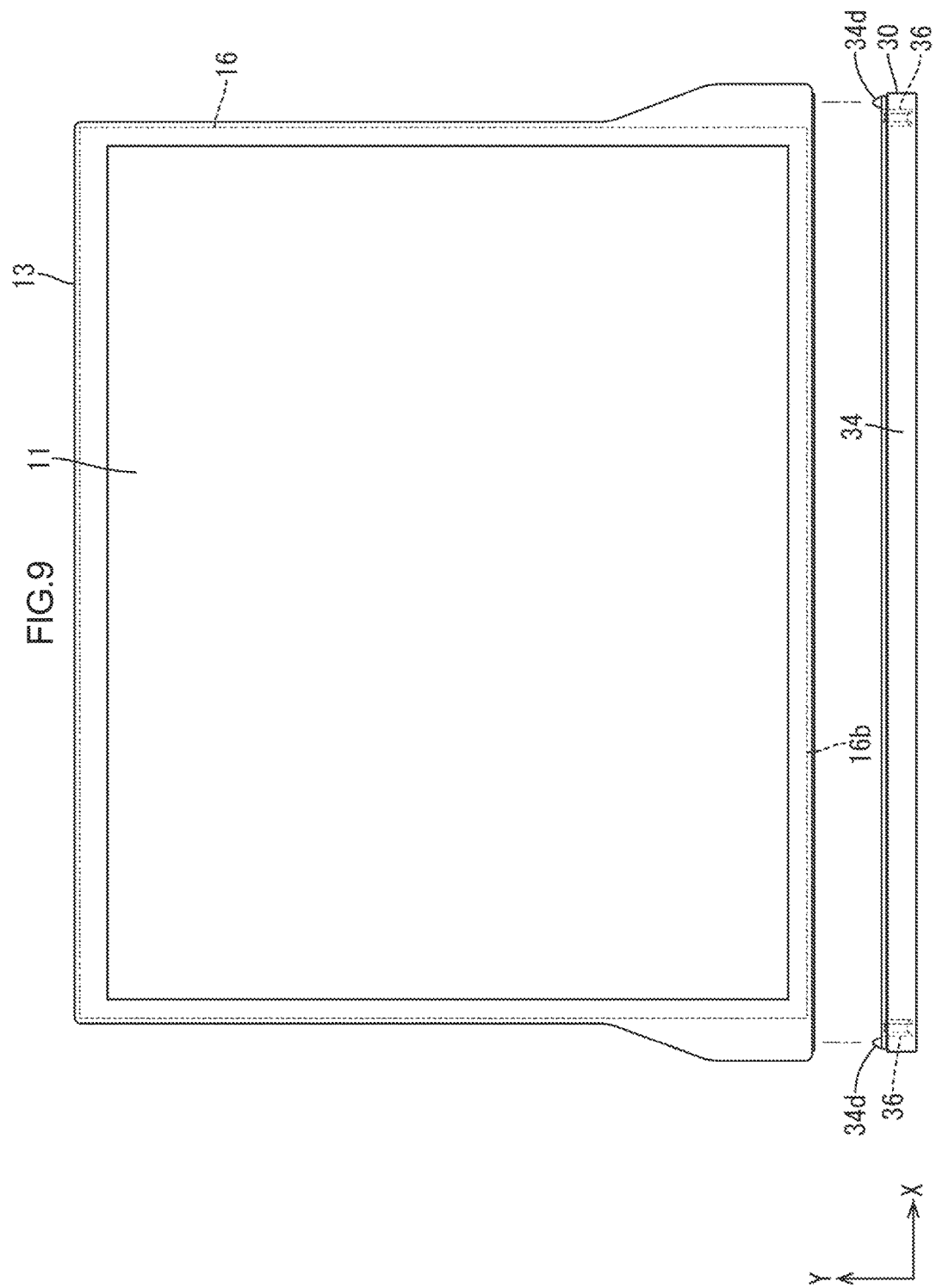
FIG. 9 is a plan view illustrating a liquid crystal display device before the LED unit is mounted therein.

The first embodiment of the present invention will be described with reference to FIGS. 1 to 13. In this embodiment, a backlight device 12 and a liquid crystal display device 10 including the backlight device 12 will be described. An X-axis, a Y-axis, and a Z-axis are present in each of the drawings for the purpose of illustration. An upper side in FIGS. 3, 7 and 8 is a front side and a lower side in the drawing is a rear side.

Figure 1:
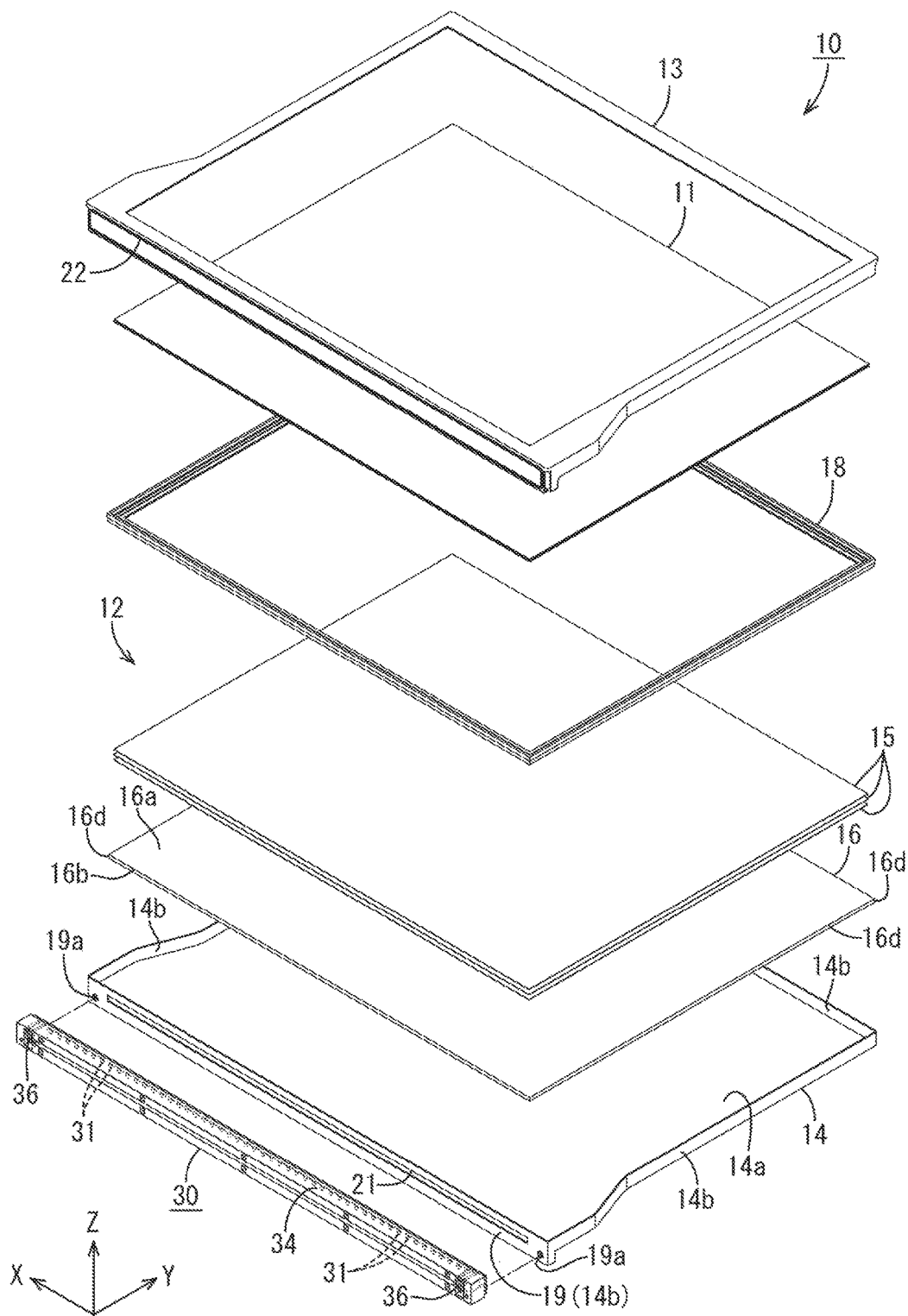
FIG. 1 is an exploded perspective view illustrating a general configuration of a liquid crystal display device according to a first embodiment of the present invention.

As illustrated in FIG. 1, the liquid crystal display device 10 according to the present technology includes a liquid crystal panel (a display panel) 11 for displaying images, a backlight device (a lighting device) 12 that provides light rays with the liquid crystal panel 11 for displaying, and a panel holding member 13 that holds the liquid crystal panel 11 to the backlight device 12.

Figure 2:
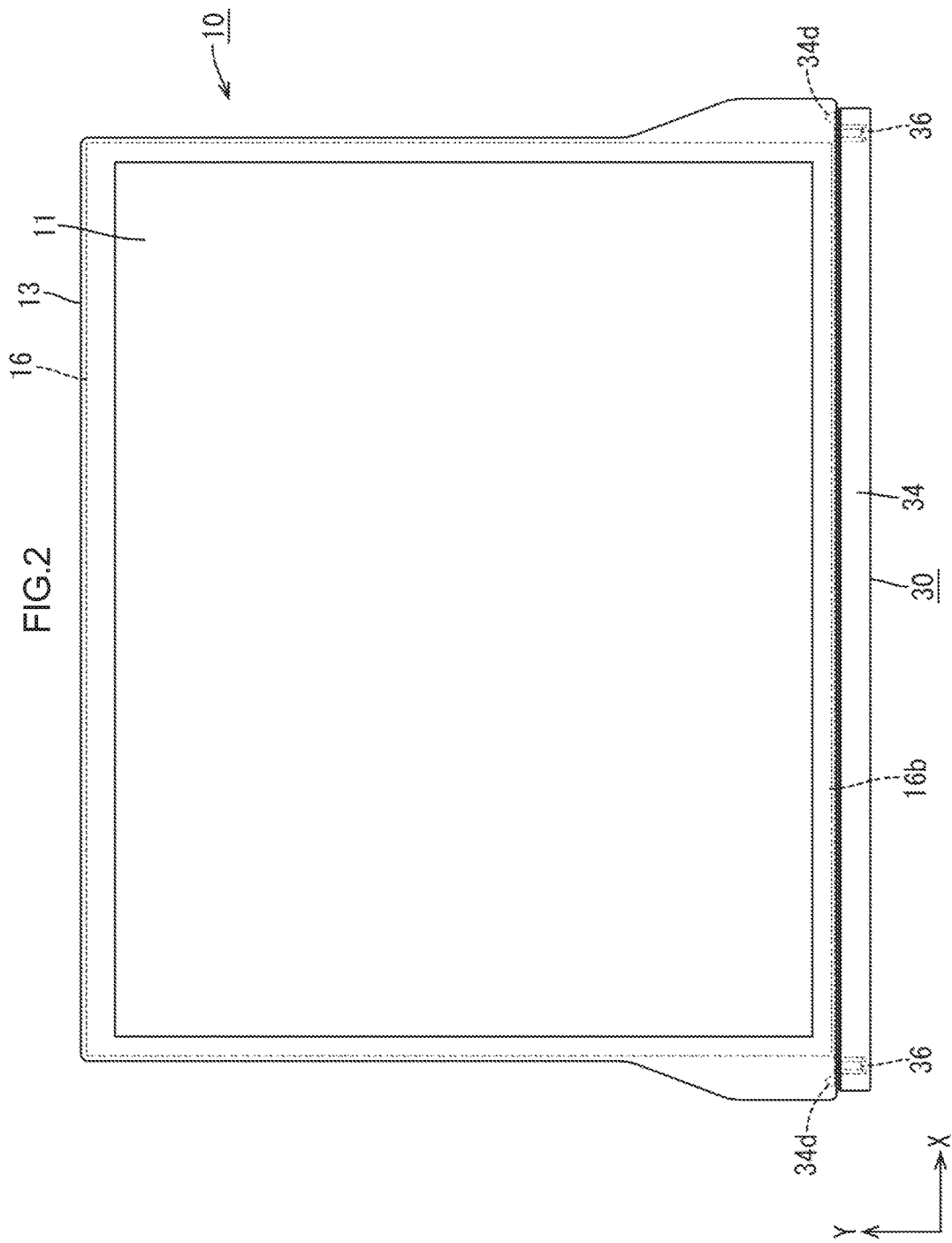
FIG. 2 is a plan view of the liquid crystal display device.
Figure 3:
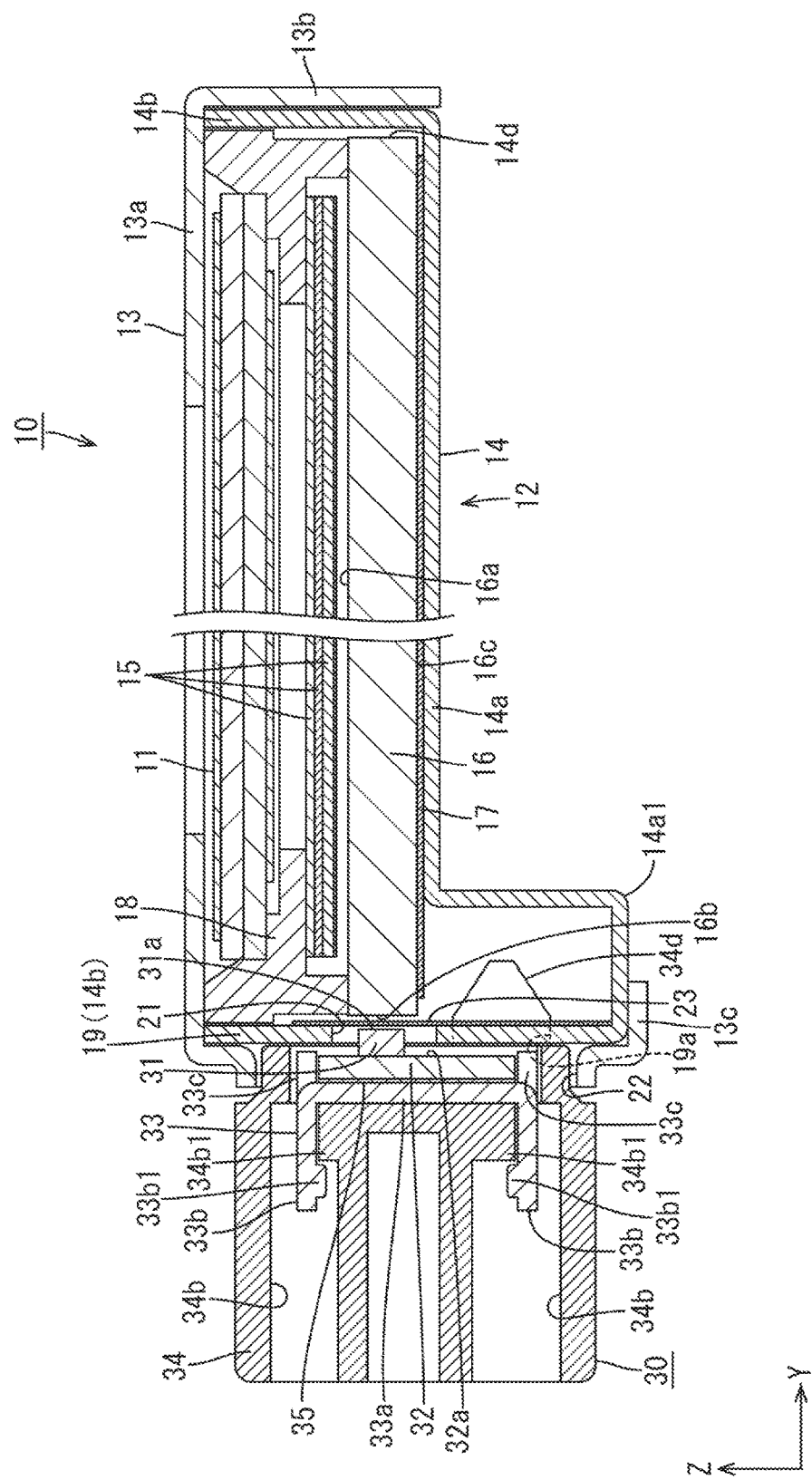
FIG. 3 is a cross-sectional view of the liquid crystal display device taken in a short-side direction thereof.

As illustrated in FIGS. 1 to 3, the liquid crystal panel (display panel) 11 has a laterally elongated rectangular overall plan view shape. The liquid crystal panel 11 includes a pair of glass substrates and a liquid crystal layer (not illustrated) sealed between the substrates. The glass substrates are bonded to each other while having a predefined clearance therebetween. The liquid crystal layer contains liquid crystal molecules whose optical properties are changed according to application of an electric field. On an inner surface side of one of the glass substrates (an array board, an active matrix board), thin film transistors (TFTs) which are switching components, and pixel electrodes are arranged, and gate lines and source lines arranged in a matrix are arranged around each of the TFTs and the pixel electrodes, and alignment films are disposed. Image signals are supplied to each of the lines from a control circuit, which is not illustrated. On an inner surface side of another one of the glass substrates (a counter substrate, a CF substrate), a color filter including color portions of red (R), green (G), blue (B) with certain arrangement in a matrix, a light shielding layer (a black matrix) that is disposed between the color portions in a matrix, counter electrodes that are disposed in a solid state and opposite the pixel electrodes, and alignment films are disposed. Polarizing plates are attached to the outer surfaces of the respective glass substrates. A long-side direction in the liquid crystal panel 11 matches the X-axis direction, a short-side direction matches the Y-axis direction, and a thickness direction matches the Z-axis direction.

As illustrated in FIGS. 1 and 3, the backlight device 12 includes a chassis 14, optical sheets 15, a light guide plate 16, a reflection sheet 17, a frame 18, and a LED unit 30. The chassis 14 has a substantially box-shape and is open toward a front side (a light exit side, a liquid crystal panel 11 side). The optical sheets 15 are layered on each other and arranged within the chassis 14. The frame 18 presses the optical sheets 15, the light guide plate 16, and the reflection sheet 17 from the front side. The LED unit 30 is detachably mounted in the chassis 14. The LED unit 30 includes LEDs 31 that are light sources, an LED board 32 where the LEDs 31 are mounted, a LED board holding member 33 that holds the LED board 32, and a unit body (a light source holding member) 34 where the LED board holding member 33 is mounted. The backlight device 12 includes the LED unit 30 on one of the long-side edge portions (on a front side in FIG. 2, on a left side in FIG. 3). The LEDs 31 included in the LED unit 30 are locally arranged on one of the long-side edge portions of the liquid crystal panel 11. The backlight device 12 according to this embodiment 12 is a so-called edge light type (a side light type) lighting device of one-side light emission type in which light from the LEDs 31 enters only one side of the light guide plate 16. Next, components included in the backlight device 12 will be described in detail.

The chassis 14 is made of a magnetic material such as metal. As illustrated in FIGS. 1 and 3, the chassis 14 includes a bottom portion 14a that has a laterally elongated rectangular shape, and side wall portions 14b each of which extends from an outer edge of each side of the bottom plate 14a toward the front side. The chassis 14 has substantially a shallow box shape (substantially shallow bowl shape) that opens frontward. In the chassis 14, a long-side direction matches the X-axis direction and a short-side direction matches the Y-axis direction. The bottom portion 14a supports the light guide plate 16 from the back side (opposite side from the light exit side) via the reflection sheet 17 and configures as a light guide plate support portion. The bottom portion 14a includes a projection portion 14a1 that projects toward a back side from an edge portion thereof near the LED unit 30 with respect to other portion. The projection portion 14a1 includes an extended portion extending substantially vertically with respect to the other portion of the bottom portion 14a and a parallel portion that extends parallel to the other portion of the bottom portion 14a and extends from a distal end or the extended portion toward the LED unit 30. The projection portion 14a1 has a cross-sectional shape of a substantially L-shape as a whole. The side wall portions 14b extend toward the front side from the respective edges of four sides of the bottom portion 14a. The side wall portion 14b extending from the long-side edge portion of the bottom portion 14a on the LED unit 30 side has an extended height dimension (a dimension in the Z-axis direction) larger than those of other three side wall portions 14b. The side wall portion 14b on the LED unit 30 side is referred to as a LED side wall portion (a light source side wall portion) 19. The LED side wall portion 19 is arranged such that a long-side direction (a length direction) on a plate surface matches the X-axis direction, a short-side direction (a width direction) matches the Z-axis direction, and a normal line to the plate surface matches the Y-axis.

As illustrated in FIGS. 1 and 3, each of the optical sheets 15 has a laterally elongated rectangular shape similar to that of the liquid crystal panel 11 and the chassis 14. The optical sheets 15 are placed on the front side of the light guide plate 16 and between the liquid crystal panel 11 and the light guide plate 16 such that the optical sheets 15 transmit light exiting the light guide plate 16 while changing optical properties of the light and transmitted light exits the optical sheets 15 toward the liquid crystal panel 11. The optical sheets 15 include multiple sheets (three in this embodiment) that are layered on one another. The optical sheets 15 include a diffuser sheet, a lens sheet, and reflective type polarizing sheet, for example, and some or all of them may be used as the optical sheets 15.

The light guide plate 16 is made of substantially transparent synthetic resin (having high light transmissivity) having a refraction index sufficiently higher than that of air (e.g., acrylic resin such as PMMA). As illustrated in FIGS.

1 and 3, the light guide plate 16 has a laterally elongated rectangular shape similar to the liquid crystal panel 11 in the plan view. The light guide plate 16 is thicker than each of the optical sheets 15, and in the light guide plate 16, the long-side direction matches the X-axis direction and the short-side direction matches the Y-axis direction, and a plate thickness direction matches the Z-axis direction. The light guide plate 16 is arranged directly below the liquid crystal panel 11 and the optical sheets 15 within the chassis 14. One of long-side peripheral edge surfaces (on the left side in FIG. 3) of the light guide plate 16 is opposite each of the LEDs 31 included in the LED unit 30 arranged on the one long-side edge portion of the backlight device. Therefore, the LEDs 31 and the light guide plate 16 are arranged in the Y-axis direction and the optical sheets 15 (the liquid crystal panel 11) and the light guide plate 16 are arranged in the Z-axis direction. The arrangement directions are perpendicular to each other. The light rays emitted by the LEDs 31 in the Y-axis direction enter the light guide plate 16 and the light rays travel within the light guide plate 16 toward the optical sheets 15 (toward the front side) and exits the light guide plate 16.

As illustrated in FIG. 3, the light guide plate 16 has plate surfaces and one of the plate surfaces facing the front side is a light exit plate surface 16a (a light exit surface) through which light rays within the light guide plate 16 exit toward the optical sheets 15 and the liquid crystal panel 11. The light guide plate 16 has peripheral edge surfaces that are adjacent to a plate surface thereof. The peripheral edge surfaces include long-side edge surfaces extending in the X-axis direction (in an arrangement direction in which the LEDs 31 are arranged, a long-side direction of the LED board 32) and one of the long-side edge surfaces (on the front side in FIG. 2) is opposite the LEDs 31 (the LED boards 32) with a certain distance therebetween. The one long-side edge surface is a light entrance edge surface (light entrance edge surface) 16b through which the light rays emitted by the LEDs 31 enter. The light entrance edge surface 16b is opposite the LEDs 31 and is an LED opposite edge surface (a light source opposite edge surface). In the light entrance edge surface 16b, a long-side direction (an extending direction, a length direction) matches the X-axis direction, a short-side direction matches the Z-axis direction, and a normal line direction matches the Y-axis direction. Other peripheral edge surfaces of the light guide plate 16 except for the light entrance edge surface 16b (the other one of the long-side edge surfaces and a pair of short-side edge surfaces) are non-light entrance edge surfaces 16d through which the light rays emitted by the LEDs 31 do not directly enter. The non-light entrance edge surfaces 16d are not opposite the LEDs and are LED non-opposite edge surfaces (light source non-opposite edge surfaces). In this embodiment, the LED non-opposite edge surfaces are referred to as the non-light entrance edge surfaces 16d. However, this term does not mean that no light rays enter through the non-light entrance edge surfaces 16d at all. For example, the light rays that leak outside from the non-light entrance edge surfaces 16d may be reflected and returned by the side wall portion 14b of the chassis 14 and the returned light rays may enter through the non-light entrance edge surfaces 16d.

As illustrated in FIG. 3, the reflection sheet 17 overlaps an opposite plate surface 16c from a rear side. The opposite plate surface 16c is a rear side surface of the light guide plate and an opposite side surface from the light exit plate surface 16a. The reflection sheet 17 is made of synthetic resin (for example, foaming PET) and has a white surface having good light reflectivity. Light rays travelling within the light guide plate 16 and reaching the opposite plate surface 16c reflects off the reflection sheet 17 and the reflected light rays are directed toward the front side, that is, the light exit plate surface 16a. The reflection sheet 17 is disposed to cover an entire area of the opposite plate surface 16c of the light guide plate 16. A light reflecting pattern (not illustrated) is formed on the opposite plate surface 16c of the light guide plate 16 that is covered with the reflection sheet 17. The light reflecting pattern includes a light reflection portion that reflects light rays within the light guide plate 16 toward the light exit plate surface 16a such that exiting of light rays through the light exit plate surface 16a is accelerated. The light reflection portion of the light reflecting pattern include light reflecting dots and a distribution density of the light reflecting dots changes according to a distance from the light entrance edge surface 16b (the LEDs 31). Specifically, the distribution density of the light reflecting dots of the light reflecting portion is increased as it is farther away from the light entrance edge surface 16b in the Y-axis direction and the distribution density is decreased as it is closer to the light entrance edge surface 16b. Accordingly, exit light from the light exit plate surface 16a is controlled to have a uniform distribution within a plane surface.

The frame 18 is made of synthetic resin. As illustrated in FIGS. 1 and 3, the frame 18 extends along outer peripheral edges of the liquid crystal panel 11, the optical sheets 15, and the light guide plate 16 and has a laterally elongated rectangular frame shape. The frame 18 is between the optical sheets 15 and the liquid crystal panel 11 with respect to the Z-axis direction. The frame 18 presses the peripheral edge portions of the optical sheets 15 and the light guide plate 16 over a substantially whole periphery thereof from the front side and support the peripheral edge portion of the liquid crystal panel 11 over a substantially whole periphery thereof from the rear side. Namely, the frame 18 functions as an optical member pressing member pressing the optical sheets 15 and the light guide plate 16 and also functions as a liquid crystal panel pressing member (a display panel pressing member) pressing the liquid crystal panel 11. The frame 18 has one rear side portion that presses the light guide plate 16 and another rear side portion that presses the optical sheets 15. The one rear side portion is on an outer side than the other rear side portion and projects further to the rear side than the other rear side portion. The frame 18 has a front side portion that supports the liquid crystal panel 11 and the front side portion has a stepped form according to steps on a rear side surface of the liquid crystal panel 11. The frame 18 has an outer edge portion that slightly projects further toward the front side than the front side surface of the liquid crystal panel 11, and the outer edge portion of the frame 18 is a receiving portion that receives the panel holding member 13, which will be described later, from the rear side.

The panel holding member 13 is made of metal and has a laterally elongated rectangular frame shape extending along the peripheral edge portion of the liquid crystal panel 11, as illustrated in FIGS. 1 to 3. The panel holding member 13 includes a panel pressing portion 13a, an outer wall portion 13b, and a backlight receiving portion (a lighting device receiving portion) 13c. The panel pressing portion 13a presses the entire peripheral edge portion of the liquid crystal panel 11 from the front side. The outer wall portion 13b projects toward the rear side from the peripheral edge of the panel pressing portion 13a and surround the backlight device 12 from the peripheral side thereof. The backlight receiving portion 13c is included in the outer wall portion 13b opposite the LED unit 30 and receives the backlight device from the rear side. The panel pressing portion 13a has a laterally elongated rectangular frame shape according to the peripheral edge portion of the liquid crystal panel 11. The outer wall portion 13b overlaps each of the side wall portions 14b on an outer side with respect to the X-axis direction or the Y-axis direction and has a dimension in the Z-axis direction that is substantially equal to that of each side wall portion 14b. Therefore, the outer wall portion 13b that is opposite the LED unit 30 and overlaps the LED side wall portion 19 has a relatively larger size in the Z-axis direction similar to the LED side wall portion 19 than the outer wall portion 13b that overlaps other side wall portions 14b. The outer wall portion 13 overlapping the LED side wall portion 19 is referred to as an LED-side outer wall portion (a light source-side outer wall portion) 20. The backlight receiving portion 13c is continuous from the LED-side outer wall portion 20 among the outer wall portions 13b and the backlight receiving portion 13c and the panel pressing portion 13a sandwich and hold the liquid crystal panel 11 and the backlight device 12 therebetween. Accordingly, the liquid crystal panel 11 and the backlight device 12 are maintained in a mounted state.

Next, the LED unit 30 will be described. Each of the LEDs 31 included in the LED unit 30 is a so-called top-surface-emitting type LED. The LEDs 31 are surface-mounted on the LED board 32 such that the light emission surfaces 31a face a side opposite from the LED board 32 side. The LEDs 31 are mounted on a base board that is fixed on the LED board 32 and the LEDs are configured by enclosing LED chips (light emitting components) with resin material on the base board. The LED chips mounted on the base board emit light having one main light emission wavelength and specifically emit single blue light. Phosphors are dispersed in the resin material with which the LED chips are enclosed and the phosphors are excited by the blue light emitted by the LED chips and emits light of predetermined color and the LEDs 17 emit substantially white light as a whole. An optical axis of the LEDs 31 matches a normal line to the light emission surface 31a or is parallel to the Y-axis direction. The "optical axis" in this specification is referred to as an axis of light rays that matches a traveling direction of light rays from the LEDs 31 having highest light emission strength (having a peak) among light rays emitted by the LEDs 31 (light distribution).

Figure 4:
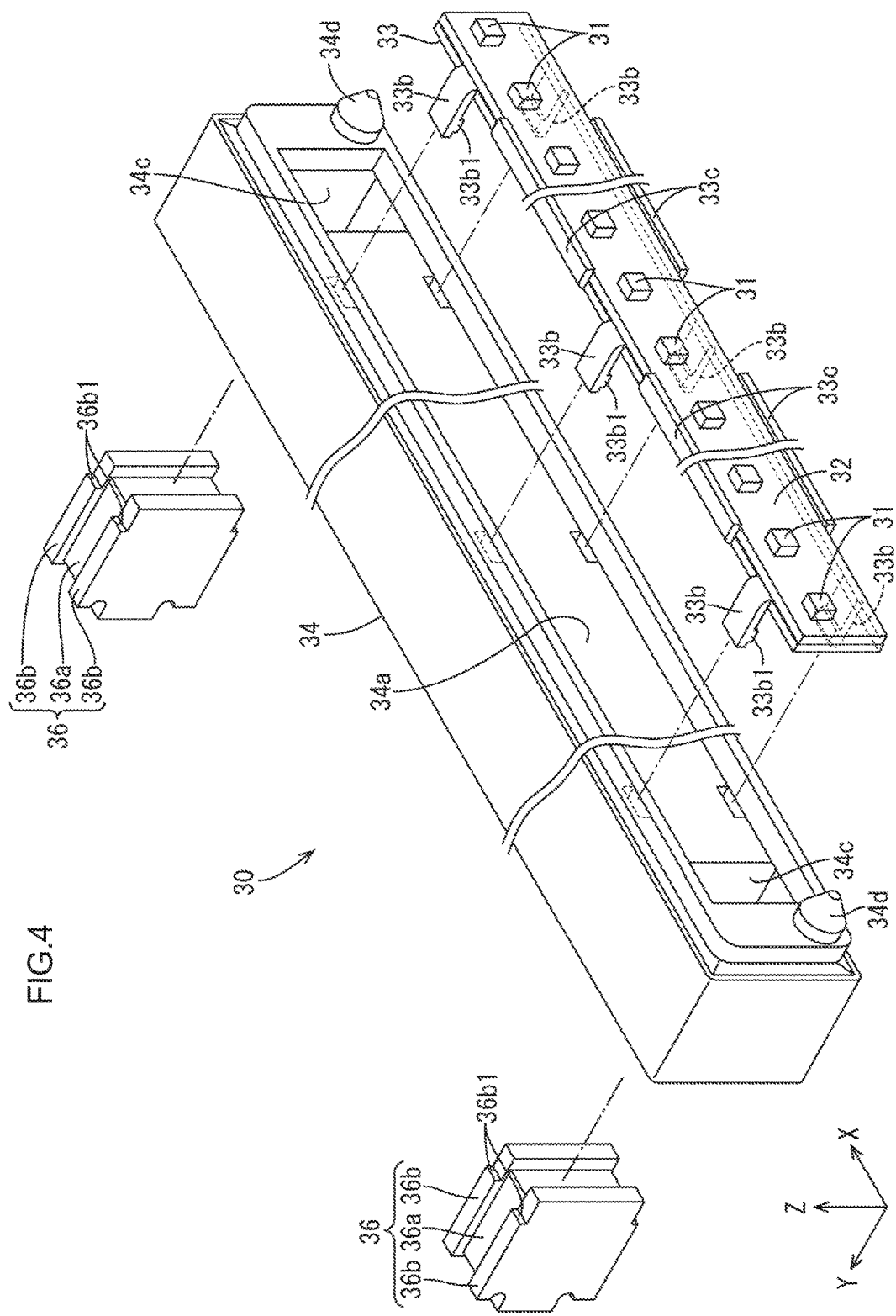
FIG. 4 is an exploded perspective view illustrating an LED unit included in a backlight device of the liquid crystal display device.

As illustrated in FIGS. 3 and 4, the LED board 32 is an elongated narrow plate that extends in the long-side direction of the chassis 13 and in the elongated direction of the LED side wall portion 19 among the side wall portions 14b (in the X-axis direction, in an extending direction of the light entrance edge surface 16b of the light guide plate 16). The LED board 32 is held by the LED board holding member 33 such that the plate surface thereof is parallel to an X-Y plane and perpendicular to plate surfaces of the liquid crystal panel 11 and the light guide plate 16 (the optical sheets 15). The LED board 32 is arranged such that a long-side direction (a length direction) thereof matches the X-axis direction and a short-side direction (a width direction) thereof matches the Z-axis direction, and a plate thickness direction that is perpendicular to the plate surface matches the Y-axis direction. The LED board 32 has a plate surface facing the light guide plate 16 (opposite the light guide plate 16) that is a mounting surface 32a where the above-structured LEDs 31 are surface-mounted. The LEDs 31 are arranged on the mounting surface 32a of the LED board 32 in a line (linearly) at predetermined intervals in the length direction (the X-axis direction). Namely, the LEDs 31 are arranged at intervals in the long-side direction at one of the long-side edge portions of the backlight device 12. Therefore, the arrangement direction in which the LEDs 31 are arranged matches the length direction (the X-axis direction) of the LED board 32 and an extending direction in which the light entrance edge surface 16b of the light guide plate 16 extend. The intervals between the adjacent LEDs 31 in the X-axis direction, that is, an arrangement space between the LEDs 31 (an arrangement pitch) are substantially equal to each other. Namely, the LEDs 31 are arranged at an equal pitch. Tracing patterns (not illustrated) made of a metal film (such as a copper foil) are formed on the mounting surface 32a of the LED board 32. The metal film extends in the X-axis direction and crosses and connects the adjacent LEDs 31 in series. A LED driving circuit board (not illustrated) is electrically connected to terminals formed on an edge portion of the trancing pattern via tracing members (not illustrated) such that driving power is supplied to each of the LEDs 31. The LED board 32 is a one-surface mounting type board and has the mounting surface 32a on only one plate surface thereof. The LED board 32 includes a substrate that is made of metal such as aluminum material and the tracing patterns (not illustrated) are formed on a surface of the substrate via an insulation layer therebetween. The substrate of the LED board 32 may be made of insulation material such as synthetic resin or ceramics.

The LED board holding member 33 holding the above LED board 32 is made of a metal plate member. As illustrated in FIGS. 3 and 4, the LED board holding member 33 includes a board mounting portion 33a where the LED board 32 is mounted and a stopper portion 33b that holds the LED board holding member 33 to the unit body 34 so as not to be detached therefrom. The board mounting portion 33a is a plate member extending parallel to the plate surface of the LED board 32. The LED board 32 is fixed to a plate surface of the board mounting portion 33a facing the light guide plate 16 via a fixing member 35 such as a double-sided adhesive tape. The board mounting portion 33a includes board support portions 33c that sandwich the LED board 32 from both sides with respect to the short-side direction (the Z-axis direction) thereof and support the LED board 32 with respect to the Z-axis direction. The board support portions 33c project from two elongated edge portions along the extending direction (the X-axis direction) of the board mounting portion 33a. Especially, the board support portions 33c project from portions of the two elongated edge portions where stopper portions 33b are not disposed and project in the Y-axis direction toward the chassis 14 and the light guide plate 16 (a right side in FIG. 3). The board support portions 33c are arranged in pairs. The stopper portions 33b are provided in pairs and continuous from the portions where a pair of board support portions 33c is not provided with respect to the extending direction of the board mounting portion 33a. The stopper portions 33b extend from the board mounting portion 33a in the Y-axis direction and in a direction farther away (the left side in FIG. 3) from the chassis 14 and the light guide plate 16 (the right side in FIG. 3) and the stopper portions 33b are free at distal end portions thereof and include stopper projections 33b1 at the distal end portions. The stopper portions 33b (three pairs of stopper portions 33b) are arranged at intervals in the X-axis direction.

The unit body 34 where the above LED board holding member 33 is mounted is made of synthetic resin. As illustrated in FIGS. 2 to 4, the unit body 34 has a laterally elongated block shape extending in the X-axis direction as a whole and the LED board 32 and the LED board holding member 33 are arranged within the unit body 34. The unit body 34 includes a LED arrangement recess portion 34a that is open toward the chassis 14 and the light guide plate 16. The LED board 32 and the LED board holding member 33 are arranged in the LED arrangement recess portion 34*a* and the LED board holding member 33 is received by a bottom surface of the LED arrangement recess portion 34*a*. The unit body 34 includes stopper holes 34*b* that are communicated with the LED arrangement recess portion 34*a* and receive the stopper portions 33*b* therein so as to be open toward an opposite side from the chassis 14 and the light guide plate 16. Each of the stopper holes 34*b* has a hole edge and a projection stopper portion 34*b*1 is formed at the hole edge of each stopper hole 34*b* such that the stopper projection 33*b*1 is stopped at the projection stopper portion 34*b*1.

As illustrated in FIGS. 3 and 4, the chassis 14 included in the backlight device 12 according to this embodiment includes a fitting hole 21 which the LEDs 31 are fit in and removed from when the LED unit 30 is mounted in and detached from the chassis 14. The fitting hole 21 is open toward a direction perpendicular to the extending direction of the light entrance edge surface 16*b*. The LED side wall portion 19 of the side wall portions 14*b* of the chassis 14 has the fitting hole 21 that is partially open toward the outside in the Y-axis direction. The fitting hole 21 is slightly greater than an area of the light entrance edge surface 16*b* and an area where the LEDs 31 are arranged. Specifically, a Z-axis dimension of the fitting hole 21 is greater than a thickness dimension of the light guide plate 16 (a short-side dimension of the light entrance edge surface 16*b*) and greater than a height dimension of the LEDs 31. An X-axis dimension of the fitting hole 21 is greater than a long-side dimension of the light guide plate 16 (a long-side dimension of the light entrance edge surface 16*b*) and greater than the area where the LEDs 31 group is arranged in the X-axis direction. When the unit body 34 holding the LEDs 31 is mounted in and detached from the chassis 14, the unit body 34 is moved in a direction that is same as the opening direction of the fitting hole 21 in the chassis 14 where the LEDs are inserted and detached according to the mounting and detaching of the unit body 34, that is, the Y-axis direction. In the chassis 14, the fitting hole 21 is open in the Y-axis direction that crosses the extending direction of the light entrance edge surface 16*b* of the light guide plate 16. Therefore, the unit body 34 is less likely to rub on the chassis 14 in the mounting and detaching of the unit body 34 compared to a prior art configuration that the hole is open in the extending direction of the light entrance edge surface 16*b*. Accordingly, dust is less likely to be produced in the mounting and detaching of the unit body 34 and workability of the mounting and detaching of the unit body 34 is improved.

Figure 6:
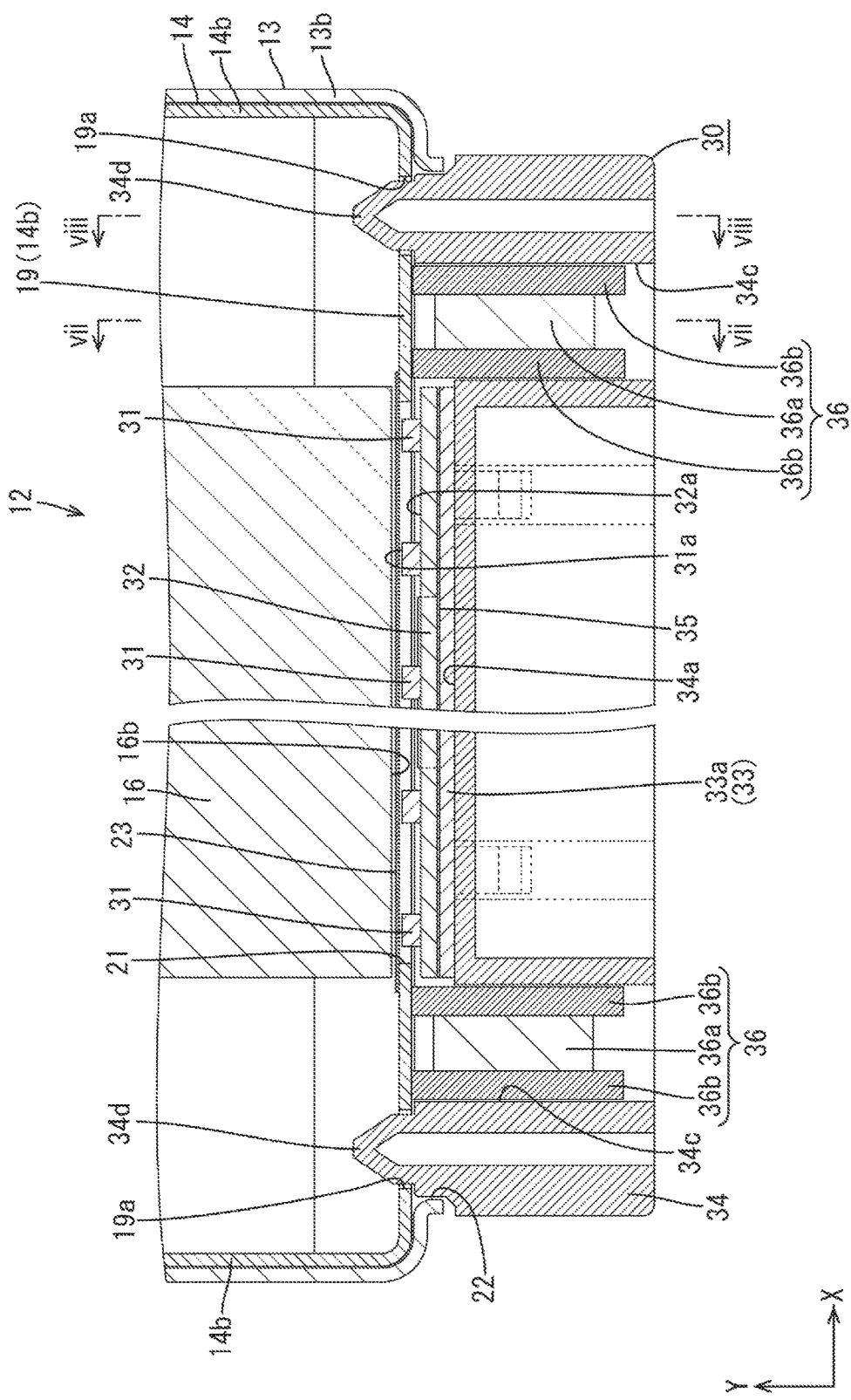
FIG. 6 is a cross-sectional view illustrating the backlight device included in the liquid crystal display device.

As illustrated in FIGS. 3 and 6, the fitting hole 21 is formed in the LED side wall portion 19 of the chassis 14 that is opposite the light entrance edge surface 16*b*. Therefore, the unit body 34 that is mounted in the chassis 14 overlaps the chassis 14 with respect to the Y-axis direction that is along a normal line to the light entrance edge surface 16*b*. According to such a configuration, the thin backlight device 12 is preferably maintained. The LED-side outer wall portion 20 of the outer wall portions 13*b* of the panel holding member 13 overlapping the side wall portion 14*b* of the chassis 14 on the outer side has a communication hole 22 that is communicated with the fitting hole 21 of the chassis 14. The communication hole 22 is larger than the fitting hole 21 and has an opening area larger than that of the fitting hole 21. Specifically, the opening area of the communication hole 22 is larger than a size of a chassis 14-side portion of the unit body 34 such that the LEDs 31 and the unit body 34 can be inserted in and removed from the communication hole 22 according to the mounting and detaching of the LED unit 30 with respect to the chassis 14.

As illustrated in FIGS. 3 and 6, a light transmissive dustproof sheet (a light transmissive dustproof member) 23 is attached on an inner surface of the LED side wall portion 19 of the chassis 14 so as to close the fitting hole 21. The light transmissive dustproof sheet 23 is made of a substantially transparent synthetic resin sheet having high light transmissivity and overlaps a most part of the inner surface of the LED side wall portion 19 while closing the whole fitting hole 21. When the LED unit 30 is detached from the chassis 14 and when the LED unit 30 is mounted in the chassis 14, the fitting hole 21 is always closed with the light transmissive dustproof sheet 23 such that dust is less likely to enter through the fitting hole 21 from the outside of the chassis 14. Accordingly, dust is less likely to adhere to the optical components (the optical sheets 15, the light guide plate 16, the liquid crystal panel 11) arranged within the chassis 14 and display quality is less likely to be deteriorated. The light rays from the LEDs 31 transmits through the light transmissive dustproof sheet 23 that is disposed between the LEDs 31 and the light entrance edge surface 16*b* of the light guide plate 16 and therefore, the light transmissive dustproof sheet 23 is less likely to hinder entrance of light through the light entrance edge surface 16*b*.

Next, a holding mechanism of connecting the LED unit 30 to the chassis 14 will be described. As illustrated in FIGS. 4, 6 and 7, the LED unit 30 includes magnet units 36 that are attached to the LED side wall portion 19 of the chassis 14 that is made of magnetic material. The LED unit 30 is maintained in the mounted state in which the LED unit 30 is mounted in the chassis 14 with an attraction force of the magnet units 36. According to such a configuration, the mounting and detaching of the LED unit 30 with respect to the chassis 14 is easy and workability is improved. Each of the magnet units 36 includes a magnet 36*a* that is a source of generating a magnetic attraction force, and a pair of yokes 36*b* that sandwich the magnet 36*a*. The magnet 36*a* has a rectangular side view plate shape. The yokes 36*b* have a substantially rectangular plate shape and have an outer shape greater than that of the magnet 36*a*. The yokes 36*b* adhere to the magnet 36*a* while sandwiching the magnet 36*a* with respect to the plate thickness direction thereof (the X-axis direction). A magnetic loop is produced by the yokes 36*b* and the attraction force of the magnetic unit 36 with respect to the chassis 14 can be increased. The unit body 34 includes a pair of magnet arrangement recess portions 34*c* in which the respective magnet units 36 are arranged. The magnet arrangement recess portion 34*c* is on each of outer end sides of the LED arrangement recess portion 34*a*, in which the LED board holding member 33 is arranged, with respect to the X-axis direction. Namely, the magnet units 36 are arranged in the LED unit 30 to sandwich the LED board 32 from both ends with respect to the X-axis direction. The magnet arrangement recess portion 34*c* is through the unit body 34 in the Y-axis direction, that is, in the front-rear direction. The magnet unit 36 is inserted into the magnet arrangement recess portion 34*c* from the opposite side from the chassis 14 (from the left side in FIG. 7) and the edge portions of the yokes 36*b* are exposed to the chassis 14 side. The magnet arrangement recess portion 34*c* and the yokes 36*b* have stepped portions 34*c*1, 36*b*1, respectively. The stepped portions 36*b*1 are stopped by the stepped portions 34*c*1 such that the magnet unit 36 is not moved further toward the chassis 14 (toward the forward side in the mounting direction) in the Y-axis direction. The magnet units 36 are arranged outside and next to the LEDs 31 in the extending direction of the light entrance edge surface 16b. Therefore, thickness of the backlight device 12 can be maintained thin and a sufficient sticking area which the magnetic units 36 stick to can be kept. The magnetic units 36 are less likely to drop off from the respective magnet arrangement recess portions 34c with stopper means, which is not illustrated.

Next, a positioning structure of positioning the LED unit 30 with respect to the chassis 14 will be described. As illustrated in FIGS. 6 and 8, the unit body 34 of the LED unit 30 includes positioning projections 34d that project in the Y-axis direction toward the chassis 14, and the LED side wall portion 19 of the chassis 14 has positioning holes 19a that receive the respective positioning projections 34d. A pair of the positioning projections 34d is formed integrally with the unit body 34 and the positioning projections 34d are arranged on outer sides (on opposite sides from the LED arrangement recess portion 34a) with respect to and next to the respective magnet arrangement recess portions 34c of the unit body 34 in the X-axis direction. The positioning projections 34d sandwich the LED board 32 and the pair of magnet units 36 from both sides with respect to the X-axis direction. Each of the projection portions 34d projects such that a projected distal end is closer to the chassis 14 than the LEDs 31. Each of the projection portions 34d is tapered and has a substantially conical shape. The positioning holes 19a in pair are formed in the LED side wall portion 19 and on outer sides (on opposite sides from the fitting hole 21) with respect to and next to the portions to which the magnet units 36 are attached in the X-axis direction. A distance between the positioning holes 19a in the X-axis direction is substantially equal to a distance between the positioning projections 34d in the X-axis direction. The positioning holes 19a are substantially circular holes with a front view and are through the LED side wall portion 19 in the thickness direction (the Y-axis direction). Each of the positioning holes 19a has a diameter that is slightly greater than a largest outer diameter of each positioning projection 34d such that the positioning projection 34d can be inserted in and removed from the positioning hole 19a.

When the LED unit 30 is mounted in the chassis 14, the positioning projections 34d are inserted in the respective positioning holes 19a such that the LED unit 30 is positioned in the chassis 14 with respect to the X-axis direction and the Z-axis direction (a direction crossing the normal line to the light entrance edge surface 16b). Accordingly, the LED unit 30 is mounted in the chassis 14 easily and the LEDs 31 are less likely to hit the edge of the fitting hole 21 during the mounting of the LED unit 30. Further, the positioning projections 34d project such that the projected distal ends thereof project further than the LEDs 31. With such a configuration, when the LED unit 30 is mounted in the chassis 14, the LEDs 31 are inserted into the fitting hole 21 after the positioning projections 34d are inserted in the respective positioning holes 19a. Therefore, the LEDs 31 are further less likely to hit the edge of the fitting hole 21 during the mounting of the LED unit 30. As illustrated in FIG. 1, the chassis 14 includes an extended portion on the LED unit 30 side extending in the X-axis direction such that the magnet units 36 are attached to the LED side wall portion 19 and the LED side wall portion 19a includes the positioning holes 19a. According to such a configuration of the chassis 14, the panel holding member 13 also includes an extended portion extending in the X-axis direction.

Figure 5:
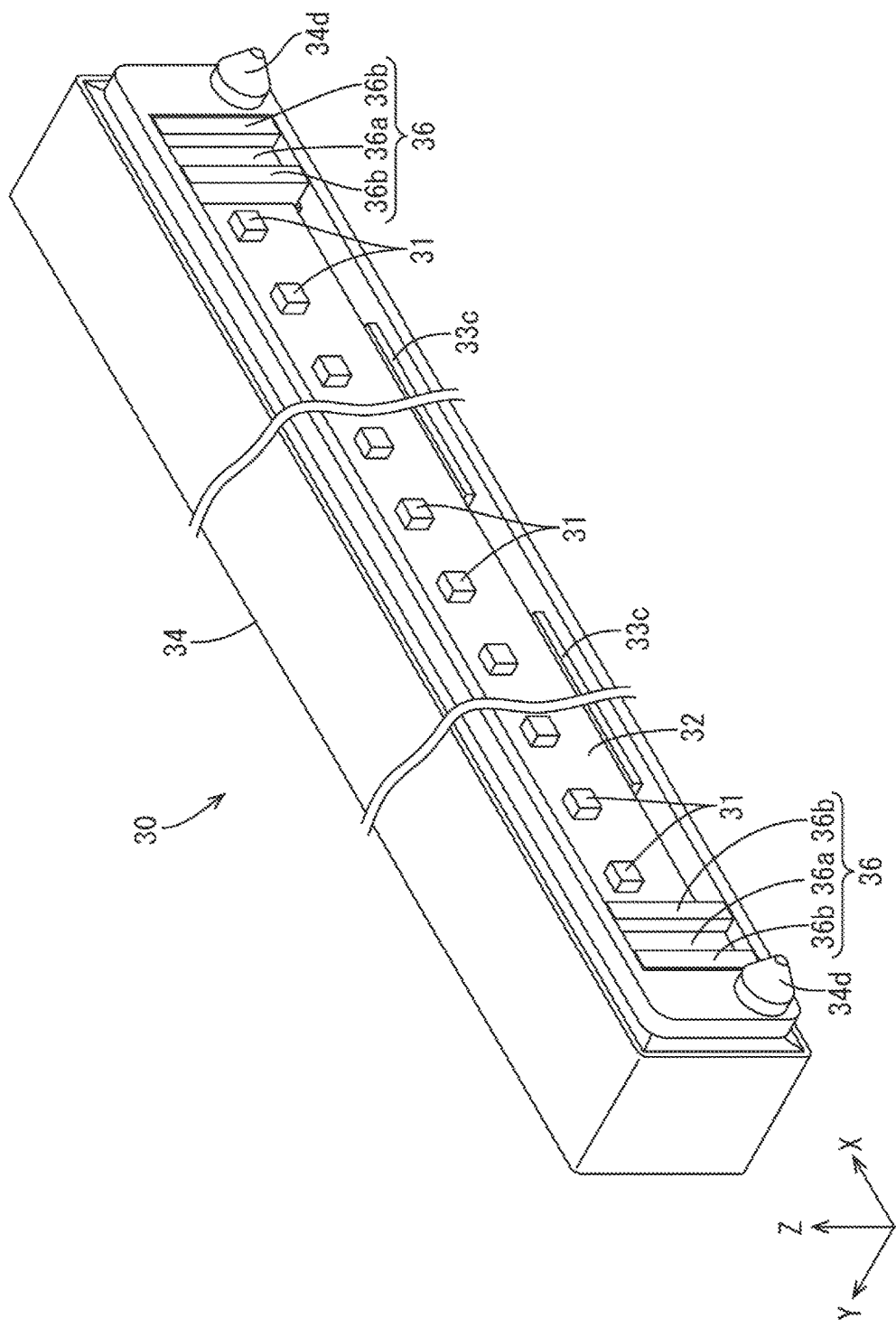
FIG. 5 is a perspective view illustrating an LED unit included in a backlight device of the liquid crystal display device.
Figure 12:
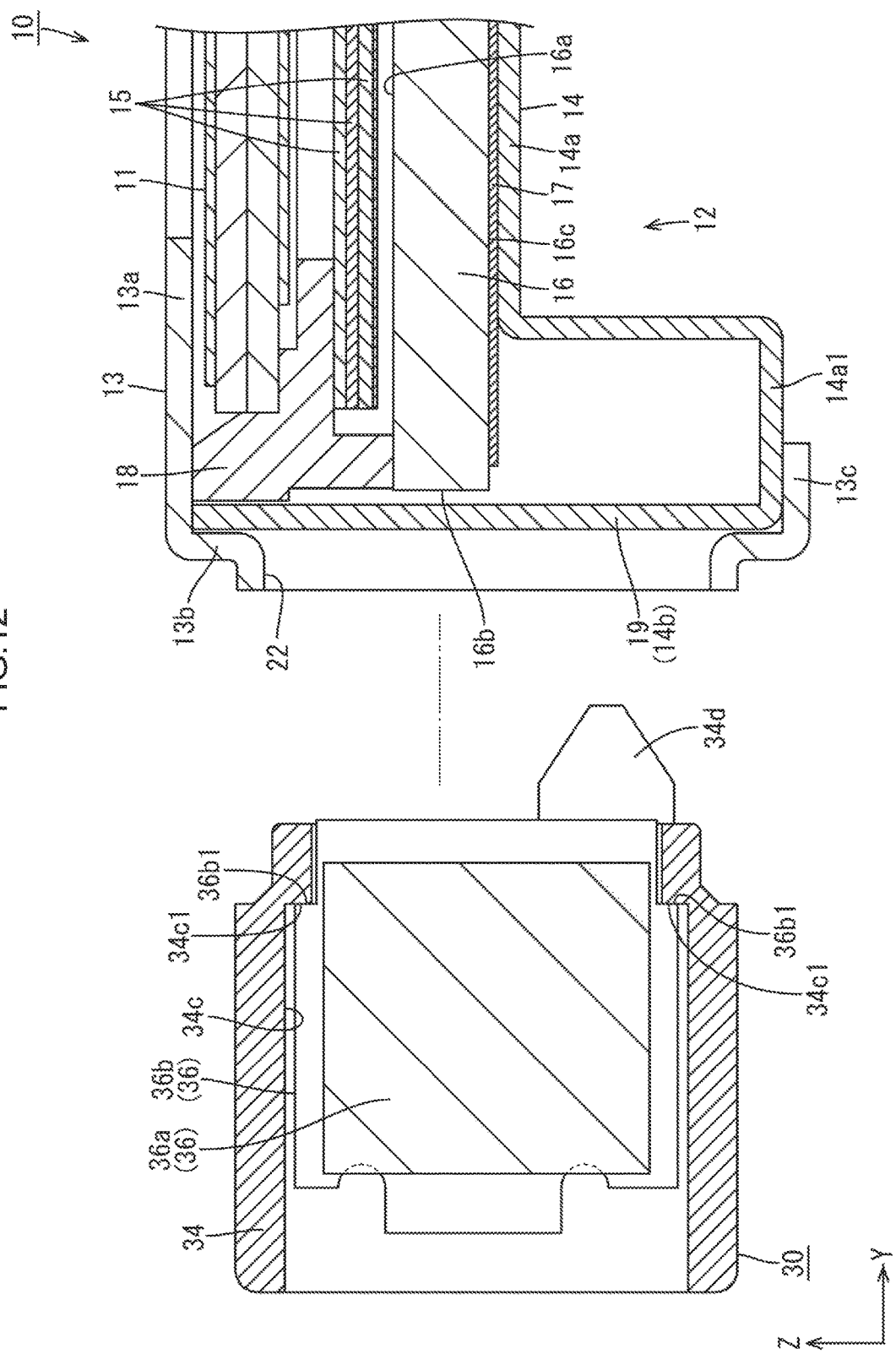
FIG. 12 is a cross-sectional view taken along line xii-xii in FIG. 11.

Next, an operation of this embodiment having the above-described configuration will be described. First, a mounting operation of assembling the LED unit 30 will be described. As illustrated in FIG. 4, the LED board holding member 33 previously holding the LED board 32 is attached to the unit body 34 in the Y-axis direction from the chassis 14 side (the right side in FIG. 4) and the magnet units 36 are attached to the unit body 34 in the Y-axis direction from the opposite side from the chassis 14 side (the left side in FIG. 4). Thus, the LED unit 30 is assembled. As illustrated in FIG. 5, the LED board holding member 33 is inserted within the LED arrangement recess portion 34a such that the stopper projections 33b1 of the stopper portions 33b are stopped by the projection stopper portions 34b1 within the stopper holes 34b. Thus, the LED board holding member 33 may not drop off from the LED arrangement recess portion 34a. When the magnet units 36 are put in the respective magnet arrangement recesses 34c as illustrated in FIG. 5, the stepped portions 36b1 of the yokes 36b are stopped by the stepped portions 34c1 of the magnet arrangement recess portions 34c as illustrated in FIG. 12. Thus, the magnet unit 36 is less likely to be moved further toward the chassis 14 (toward the forward side in the mounting direction) in the Y-axis direction.

Figure 10:
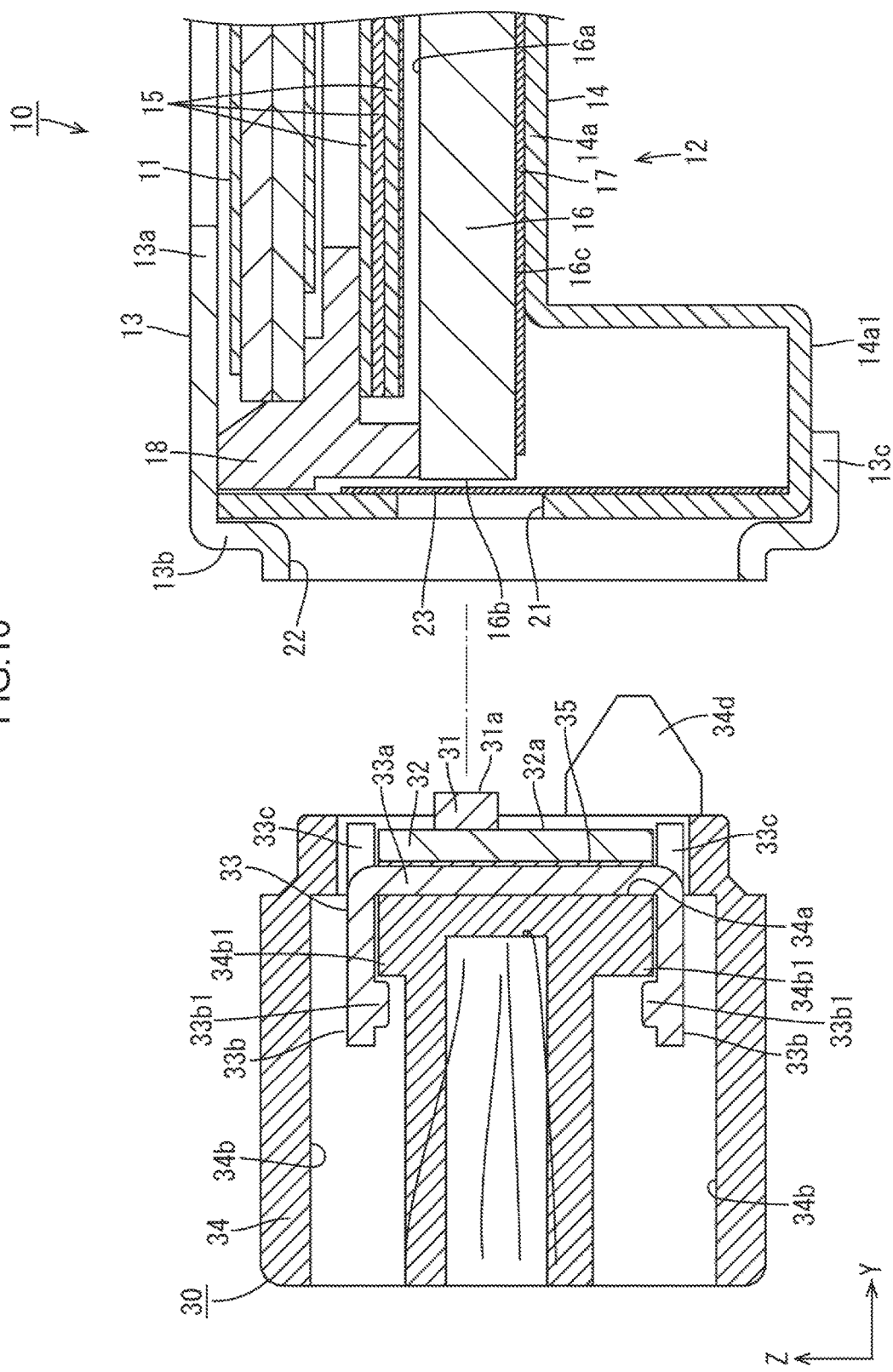
FIG. 10 is a cross-sectional view illustrating the liquid crystal display device before the LED unit is mounted therein and taken in the short-side direction of the liquid crystal display device.
Figure 11:
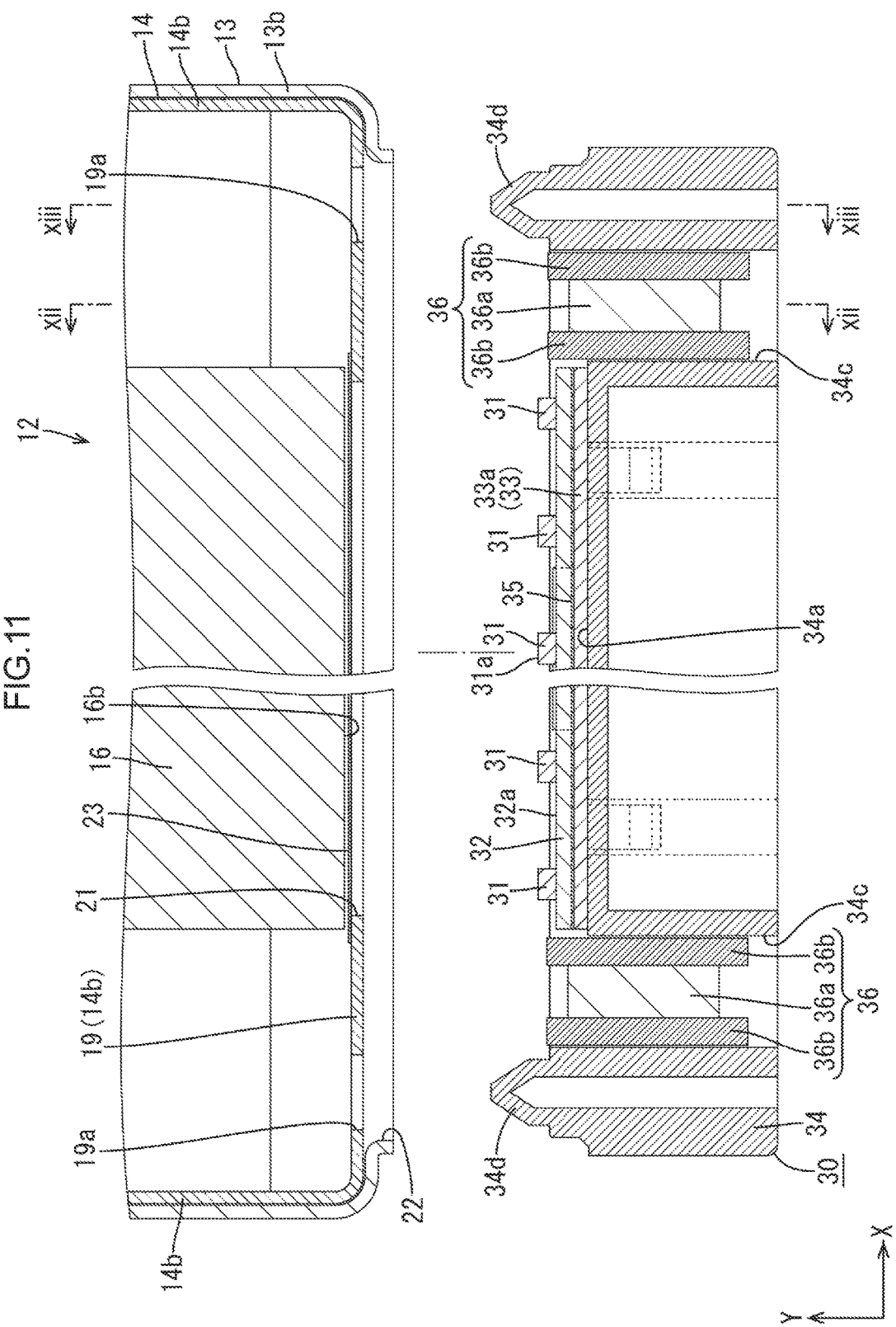
FIG. 11 is a cross-sectional view illustrating a liquid crystal display device before the LED unit is mounted therein.
Figure 13:
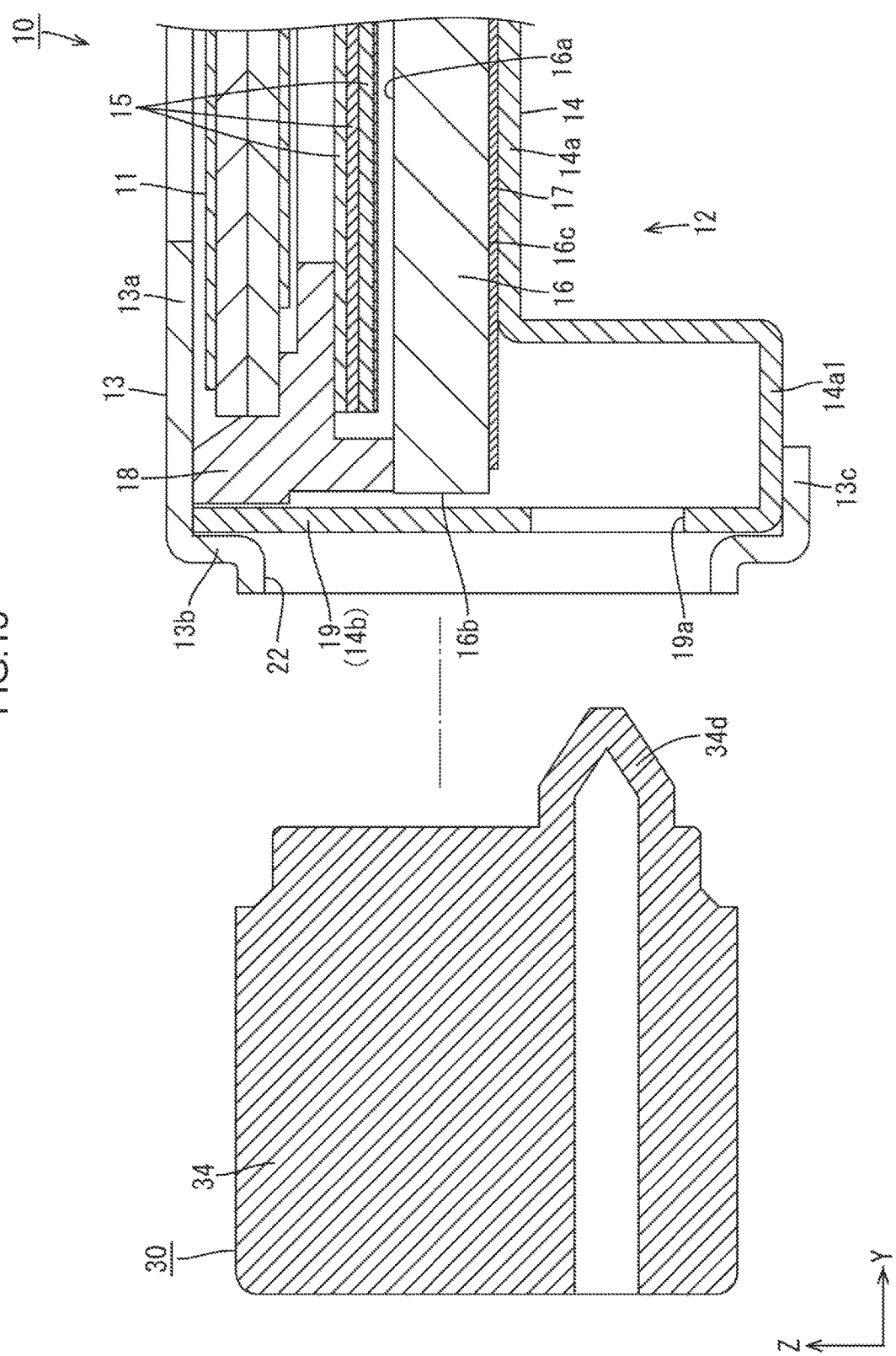
FIG. 13 is a cross-sectional view taken along line xiii-xiii in FIG. 11.

Next, a mounting operation of mounting the LED unit 30 in the chassis 14 will be described. As illustrated in FIGS. 9 to 13, the unit body 34 of the LED unit 30 that is arranged to be spaced from the chassis 14 and the panel holding member 13 in the Y-axis direction is moved closer to the chassis 14 and the panel holding member 14 in the Y-axis direction. Then, as illustrated in FIG. 13, the positioning projections 34d projecting further toward the chassis 14 than the LEDs 31 are inserted into the respective positioning holes 19a of the LED side wall portion 19 of the chassis 14 prior to the LEDs 31. Thus, the LED unit 30 is positioned with respect to the chassis 14 in the X-axis direction and the Z-axis direction that are perpendicular to the Y-axis direction that is the mounting direction of the LED unit 30. After the positioning of the LED unit 30 is performed with the positioning structure, the LEDs 31 are inserted through the communication hole 22 of the panel holding member 13 and into the fitting hole 21 of the LED side wall portion 19 of the chassis 14 as illustrated in FIGS. 10 and 11. Therefore, each of the LEDs 31 is less likely to hit the edge of the fitting hole 21 and to be damaged. In this process, a part of the unit body 34 is inserted in the communication hole 22 of the panel holding member 13.

If the LED unit 30 is moved toward the chassis 14 from the state of FIG. 12 and the magnetic force of the magnet units 36 acts on the LED side wall portion 19 as the attraction force, the LED unit 30 is attracted to the chassis 14 with the attraction force. Then, as illustrated in FIG. 7, the yokes 36b of the magnet units 36 are in contact with the LED side wall portion 19. In this contact state, as illustrated in FIGS. 3 and 6, the LEDs 31 are inserted in the fitting hole 21 of the LED side wall portion 19, a part of the unit body 34 is inserted in the communication hole 22 of the panel holding member 13, and the positioning projections 34d are inserted in the respective positioning holes 19a. Thus, the LED unit 30 is mounted in the chassis 14 and is maintained to be mounted in the chassis 14 with the magnetic attraction force of the magnet units 36.

The LED unit 30 mounted in the chassis 14 as described above is detached from the chassis 14 for maintenance or repair of the device (such as replacement of the LED board 31). If the LED unit 30 that is in the mounted state in FIGS. 3 and 6 is detached from the chassis 14, the unit body 34 of the LED unit 30 is moved in the Y-axis direction to be separated from the chassis 14 and the panel holding member 13. If the force of separating the unit body 34 from the chassis 14 is greater than the magnetic attraction force of the magnet units 36 to the LED side wall portion 19, the yokes 36b are released from the LED side wall portion 19 and the LED unit 30 is released from the holding state. Accordingly, the LED unit 30 can be easily detached from the chassis 14 and the panel holding member 13. After the maintenance or the repair of the device is finished, the LED unit 30 is mounted in the chassis 14 in the same sequence as described before.

As described before, when the LED unit 30 is mounted in and detached from the chassis 14, the LED unit 30 is moved closer to or away from the chassis 14 in the Y-axis direction that crosses the X-axis direction or the extending direction of the light entrance edge surface 16b. Therefore, the unit body 34 is less likely to be rubbed on the chassis 14 compared to a structure in that the LED unit is moved in the X-axis direction. Accordingly, dust is less likely to be produced due to the mounting and detaching of the LED unit 30 and the optical properties of the backlight device 12 is less likely to be deteriorated and high display quality of images appearing on the liquid crystal panel 11 can be maintained. Further, the workability of mounting and detaching of the LED unit 30 with respect to the chassis 14 is also good.

As described before, the backlight device (the lighting device) 12 of this embodiment includes the LEDs (a light source) 31, the unit body (a light source holding member) 34, the light guide plate 16, and the chassis (a casing) 14. The unit body 34 holds the LEDs 31. The light guide plate 16 has the light entrance edge surface 16b through which light rays from the LEDs 31 enter and the light exit plate surface 16a through which the light rays exit. The light entrance surface 16b is one of the peripheral edge surfaces of the light guide plate 16 and extends along the peripheral edge. The light exit plate surface 16a is one of the pair of plate surfaces of the light guide plate 16. The LEDs 31 and the light guide plate 16 are arranged in the chassis 14. The unit body 34 is detachably mounted in the chassis 14. The chassis 14 has the fitting hole 21 that is open in a direction crossing the extending direction of the light entrance edge surface 16b such that the LEDs 31 are inserted in and removed from the fitting hole 21 according to the mounting and detaching of the unit body 34.

According to such a configuration, the light rays emitted by the LEDs 31 enter the light guide plate 16 through the light entrance edge surface 16b and travel within the light guide plate 16 and exit through the light exit plate surface 16a. The unit body 34 holding the LEDs 31 is detachably mounted in the chassis 14 and the moving direction of the unit body 34 in the mounting and detaching is same as the direction in which the fitting hole 21 opens. The LEDs 31 are inserted in and removed from the fitting hole 21 of the chassis 14 according to the mounting and detaching of the unit body 34. In the chassis 14, the fitting hole 21 opens in a direction crossing the extending direction of the light entrance edge surface 16b of the light guide plate 16. Therefore, the unit body 34 is less likely to be rubbed on the chassis 14 in the mounting and detaching of the unit body 34 compared to a structure in that the fitting hole 21 opens in the extending direction of the light entrance edge surface 16b. Accordingly, dust is less likely to be produced according to the mounting and detaching of the unit body 34 and the workability of mounting and detaching of the unit body 34 is improved.

The chassis 14 includes at least the side wall portion 14b that is opposite the light entrance edge surface 16b of the light guide plate 16 and the fitting hole 21 is formed in the side wall portion 14b. The fitting hole 21 which the LEDs 31 are inserted in and removed from according to the mounting and detaching of the unit body 34 is formed in the side wall portion 14b of the chassis 14 and therefore, the unit body 34 that is mounted in the chassis 14 is arranged to overlap the chassis 14 with respect to the normal line to the light entrance edge surface 16b. According to such a configuration, the backlight device 12 is preferably maintained to be thin.

The device further includes the light transmissive dustproof sheet (a light transmissive dustproof member) 23 through which the light rays from the LEDs 31 transmit. The light transmissive dustproof sheet 23 is arranged to close the fitting hole 21 of the chassis 14. The fitting hole 21 is covered with the light transmissive dustproof sheet 23 and dust is less likely to enter the chassis 14 from the outside through the fitting hole 21. The light rays from the LEDs 31 can transmit through the light transmissive dustproof sheet 23 although the light transmissive dustproof sheet 23 is between the LEDs 31 and the light entrance edge surface 16b of the light guide plate 16. Therefore, the light transmissive dustproof sheet 23 is less likely to hinder entrance of light through the light entrance edge surface 16b of the light guide plate 16.

One of the unit body 34 and the chassis 14 includes the LED side wall portion 19 that is a magnetic member as at least a part thereof. Another one of the unit body 34 and the chassis 14 includes the magnet 36a as a part thereof and the magnets 36a stick to the LED side wall portion 19 that is the magnetic member. According to such a configuration, the magnets 36a stick to the LED side wall portion 19 that is the magnetic member such that the unit body 34 is held by the chassis 14. Therefore, the unit body 34 is mounted in and detached from the chassis 14 easily and workability is good.

The magnets 36a are arranged on an outer side with respect to the LEDs 31 and next to the LEDs 31 in the extending direction. According to such a configuration, the backlight device 12 can be maintained to be thin and keep a sufficient sticking area where the magnets 36a stick compared to a structure in which the magnets are arranged on an outer side with respect to the LEDs 31 and next to the LEDs 31 in the direction of the normal line to the light entrance edge surface 16b and in the direction perpendicular to the extending direction.

One of the unit body 34 and the chassis 14 includes the positioning projections 34d that project toward the other one of the unit body 34 and the chassis 14 in the direction of a normal lien to the light entrance edge surface 16b. The other one of the unit body 34 and the chassis 14 includes the positioning holes 19a receiving the respective positioning projections 34d. According to such a configuration, when the unit body 34 is mounted in the chassis 14, the positioning projections 34d are inserted in the respective positioning holes 19a such that the unit body 34 is positioned in the chassis 14 with respect to the direction crossing the normal line to the light entrance edge surface 16b. Accordingly, the unit body 34 is mounted in the chassis 14 easily and the LEDs 31 are less likely to hit the edge of the fitting hole 21 during the mounting of the LED unit 30.

The positioning projections 34d are included in the unit body 34 and project such that the projected distal ends thereof project further than the LEDs 31. According to such a configuration, when the unit body 34 is mounted in the chassis 14, the LEDs 31 are inserted into the fitting hole 21 after the positioning projections 34d are inserted in the respective positioning holes 19a. Therefore, the LEDs 31 are further less likely to hit the edge of the fitting hole 21 during the mounting of the LED unit 30.

The liquid crystal display device (a display device) 10 according to this embodiment includes the above-described backlight device 12 and the liquid crystal panel (a display panel) 11 that displays images with using light rays from the backlight device 12. According to such a liquid crystal display device 10 having the above configuration, dust is less likely to be produced according to the mounting and detaching of the unit body 34 in the backlight device 12 and workability of the mounting and detaching of the unit body 34 is improved. Therefore, display with excellent display quality can be achieved and workability of maintenance operations is improved.

Second Embodiment

A second embodiment of the present invention will be described with reference to FIGS. 14 to 16. Configurations, operations, and effects similar to those of the first embodiment will not be described.

Figure 15:
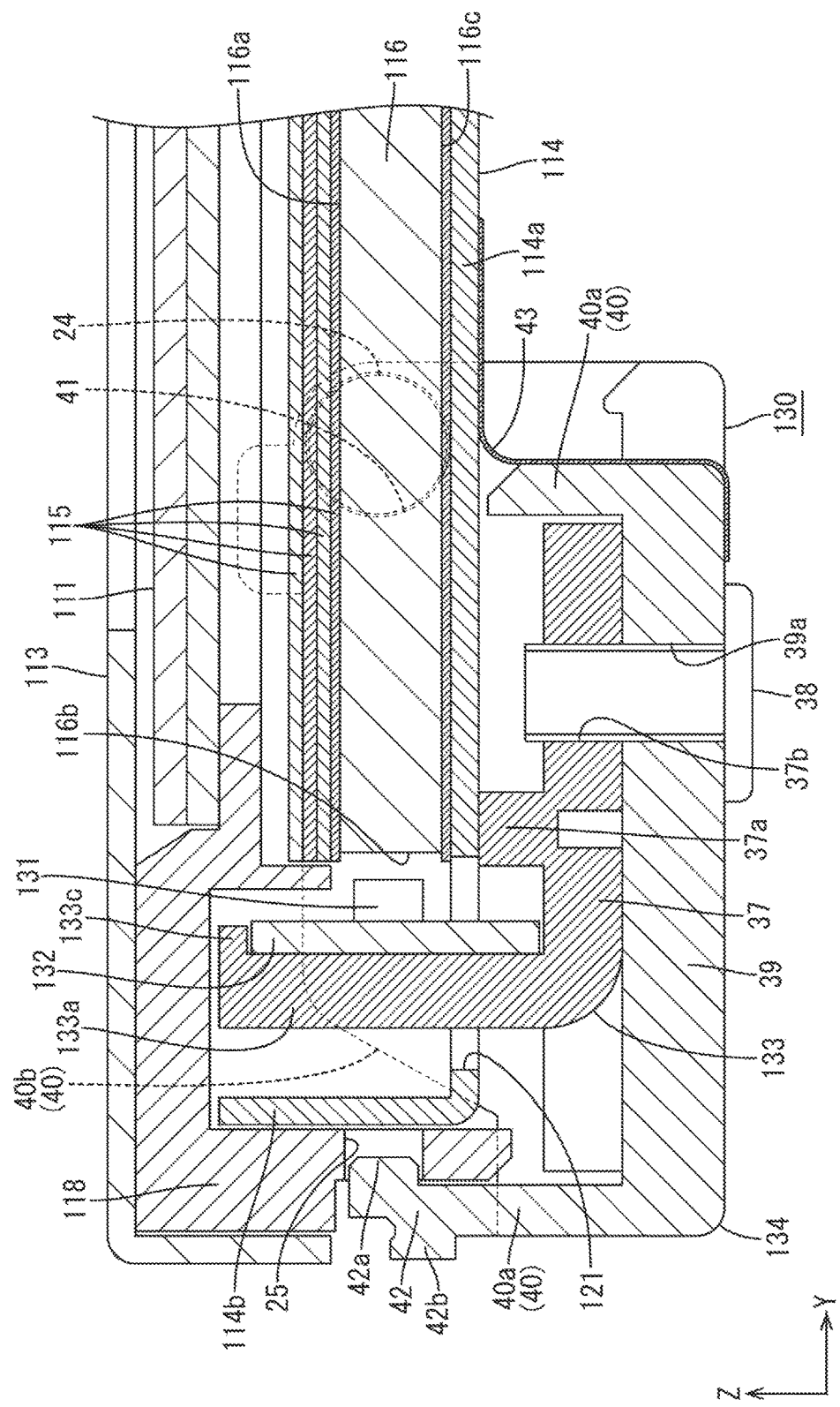
FIG. 15 is a cross-sectional view illustrating the liquid crystal display device and taken in the short-side direction.

As illustrated in FIG. 15, a chassis 114 of this embodiment includes a bottom portion 114a, and the bottom portion 114a has a fitting hole 121 which LEDs 131 are inserted in and removed from according to mounting and detaching of a LED unit 130. Namely, the fitting hole 121 opens in the Z-axis direction that is perpendicular to the Y-axis direction that is a direction of a normal line to a light entrance edge surface 116b of a light guide plate 116 and is also perpendicular to the X-axis direction that is an extending direction of the light entrance edge surface 116b. Accordingly, when a LED unit 130 (a unit body 134 holding the LEDs 131) is mounted in or detached from the chassis 114, the LED unit 130 is moved in a direction in which the fitting hole 121 opens, that is, in the Z-axis direction. The LEDs 131 are inserted in and removed from the fitting hole 121 according to the mounting and detaching of the LED unit 130 with respect to the chassis 114. The fitting hole 121 is formed in the bottom portion 114a of the chassis 114. With such a configuration, even if light leaks through the fitting hole 121 of the chassis 114, the leaking light is less likely to be seen from the light exit side of the light guide plate 116 and light leaking is less likely to be recognized. The bottom portion 114a of the chassis 114 is a flat plate over an entire area thereof. The chassis 114 differs from that of the first embodiment in that the chassis 114 does not include the projection portion 14a1 (see FIG. 3). A frame 118 includes a portion supporting a liquid crystal panel 111 and optical sheets 115 and includes a portion overlapping a side wall portion 114b of the chassis 114 on an outer side thereof. The former portion of the frame 118 supports the light guide plate 116 via the optical sheets 115. A panel holding member 113 differs from that of the first embodiment in that the panel holding member 113 does not include the communication hole 22 and the backlight receiving portion 13c (see FIG. 3). The optical sheets 15 include four sheets.

As illustrated in FIG. 15, the LED unit 130 that is detachably mounted in the chassis 114 having the above-described fitting hole 121 overlaps the chassis 114 on a rear side thereof with respect to the direction in which the fitting hole 121 opens (the Z-axis direction). The LED board holding member 133 of the LED unit 130 includes a board mounting portion 133a on which the LED board 132 is mounted and a body mounting portion 37 on which the unit body 134 is mounted. The board mounting portion 133a and the body mounting portion 37 are connected perpendicularly to each other and the LED board holding member 133 has a substantially L-shaped cross sectional shape as a whole. When the LEDs 131 are inserted through the fitting hole 121 and opposite the light entrance surface 116b of the light guide plate 116 (in a mounted state which will be described later), the body mounting portion 37 is opposite the bottom portion 114a of the chassis 114 on the rear side. The body mounting portion 37 has a bottom contact projection 37a that projects toward the front side from a part of the body mounting portion 37 and is contacted with the rear surface of the bottom portion 114a. The body mounting portion 37 further has a fixing member hole 37b through which a fixing member 38 is inserted and fixed. The LED board holding member 133 is fixed to the unit body 134 with the fixing member 38. The fixing member 38 is a screw and the fixing member hole 37b is a screw hole where a thread of the fixing member 38 (a screw) is engaged. The board mounting portion 133a has a board support portion 133c and the LED board 132 is held between the board support portion 133c and the body mounting portion 37. The LED board holding member 133 differs from that of the first embodiment in that the LED board holding member 133 does not include the stopper portions 33b (see FIG. 3).

As illustrated in FIG. 15, the unit body 134 of the LED unit 130 has a substantially bottomed tubular shape as a whole. The unit body 134 includes a bottom wall portion 39 and a tubular wall portion 40. The bottom wall portion 39 is parallel to the bottom portion 114a of the chassis 114 and the body mounting portion 37 of the LED board holding member 133. The tubular wall portion 40 extends upward from a peripheral edge of the bottom wall portion 39. The chassis 114 and the LED board holding member 133 are covered with the bottom wall portion 39 and the tubular wall portion 40 of the unit body 134 from the back side and an outer side. The body mounting portion 37 of the LED board holding member 133 is fixed to the bottom wall portion 39 with the fixing member 38 in the mounted state so as to be in contact with an inner wall surface of the bottom wall portion 39. The bottom wall portion 39 has a through hole 39a through which the fixing member 38 is inserted and the through hole 39a is communicated with the fixing member hole 37b. The tubular wall portion 40 has a square tubular shape as a whole and includes a pair of first side wall portions 40a and a pair of second side wall portions 40b. The first side wall portions 40a extends from two edges of the bottom wall portion 39 with respect to the Y-axis direction, respectively, and the second side wall portions 40b extend from two edges of the bottom wall portion 39 with respect to the X-axis direction, respectively. One of the first side wall portions 40a that is disposed on an outer side with respect to the chassis 114 in the Y-axis direction overlaps the side wall portion 114b of the chassis 114 and the frame 118 on the outer side thereof. Another one of the first side wall portions 40a has an extended distal end surface that is opposite the bottom portion 114a of the chassis 114. An inner surface of the other first side wall portion 40a is opposite the end surface of the body mounting portion 37. A dustproof sheet (a dustproof member) 43 is disposed on the other first side wall portion 40a and the bottom portion 114a of the chassis 114 such that dust is less likely to enter through a gap between the other first side wall portion 40a and the bottom portion 114a. The dustproof sheet 43 has flexibility and extends and is curved along the other first side wall portion 40a and the bottom portion 114a of the chassis 114.

Figure 14:
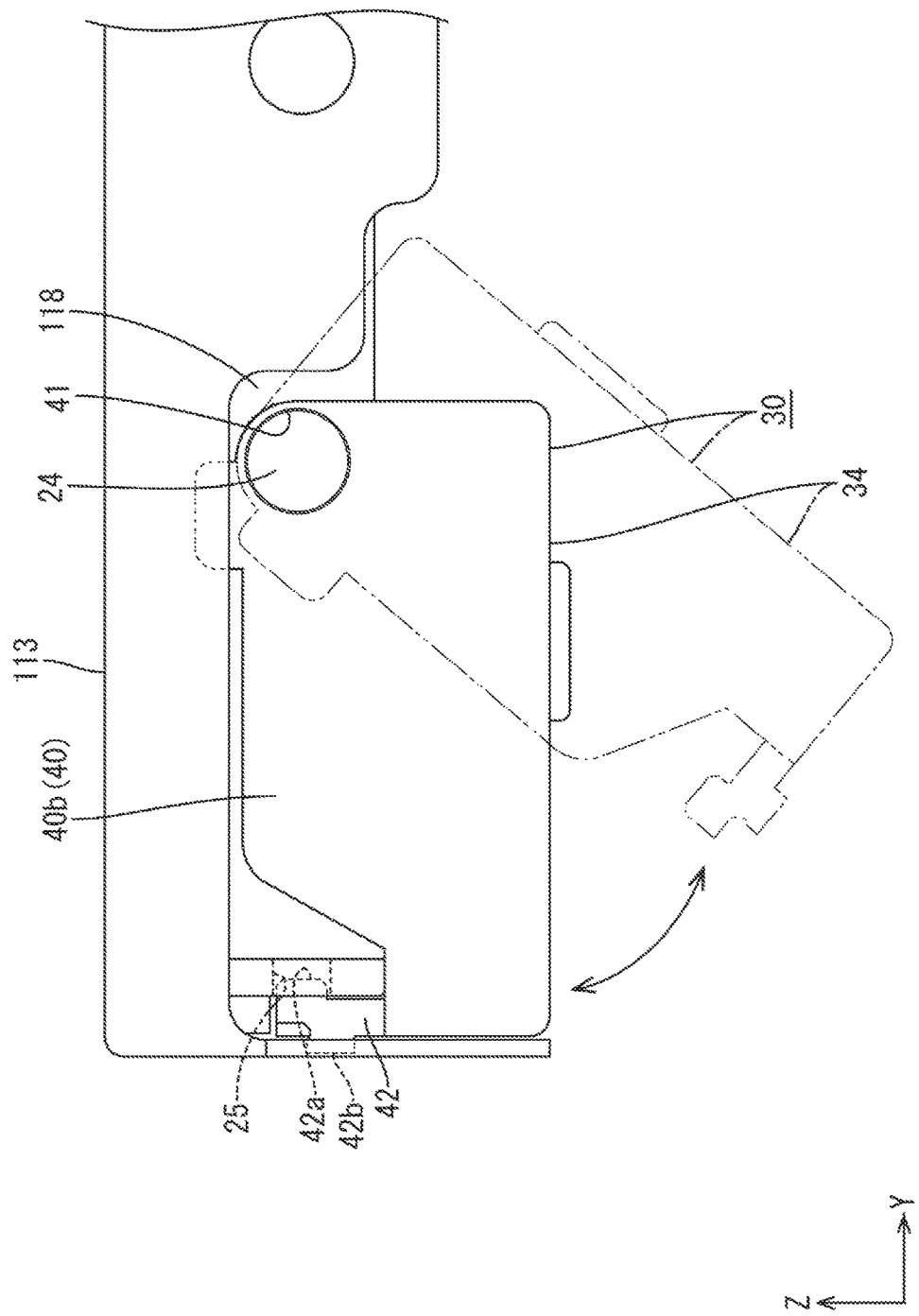
FIG. 14 is a side view of a liquid crystal display device according to a second embodiment of the preset invention.

As illustrated in FIG. 14, the LED unit 130 and the chassis 114 include a rotation mechanism that connects the chassis 114 and the LED unit 130 with a shaft such that the LED unit 130 is rotated with respect to the chassis 114. The rotation mechanism includes a rotation shaft 24 and a bearing recess 41. The rotation shaft 24 is mounted on the frame 118 that is fixed to the chassis 114 and the bearing recess 41 is formed in the unit body 134 of the LED unit 130 and support the rotation shaft 24. The rotation shaft 24 projects outward from an outer surface of a pair of parts of the frame 118 extending in the Y-axis direction and has a substantially columnar shape. Therefore, the rotation shafts 24 are parallel to the X-axis direction that is an extending direction of the light entrance edge surface 116b. The bearing recesses 41 are formed in a pair of second side wall portions 40b of the tubular wall portion 40 of the unit body 134 so as to be through the respective second side wall portions 40b in a thickness direction (the X-axis direction). Each of the bearing recesses 41 is a substantially circular hole. The bearing recesses 41 are formed in edge portions of the pair of second side wall portions 40b on an opposite side from the LED 131 side (a stopper portion 42 side, which will be described later) with respect to the Y-axis direction. The LED unit 130 pivotally supported with the rotation mechanism having the above-described configuration is rotatably moved between two states including a mounted state (FIGS. 14 and 15) and an open state (a double-dot chain line in FIG. 14 and FIG. 16). In the mounted state, the LEDs 131 and the LED board 132 are inserted in the fitting hole 121 and the plate surfaces of the LED board 132 and the board mounting member 133a are parallel to the light entrance edge surface 116b of the light guide plate 116, and the plate surfaces of the body mounting portion 37 and the bottom wall portion 39 are parallel to the plate surface of the bottom portion 114a of the chassis 114. In the open state, the LEDS 131 and the LED board 132 are outside the fitting hole 121. As illustrated in FIG. 16, in the open state, an entire area of the LED board is outside the fitting hole 121 and a certain space is between the LED board 132 and the bottom portion 114a such that the LED board 132 can be replaced with another one. Further, in the open state, the LED board holding member 133 may be detached from the unit body 134 such that the LED board 132 can be replaced with another one. The LED unit 130 can be rotated around the rotation shaft 24 to be moved between the two states along an arched path that is coaxial with the rotation shaft 24. The moving direction of the LED unit 130 according to the rotation crosses the X-axis direction that is the extending direction of the light entrance edge surface 116b of the light guide plate 116 and along substantially Z-axis direction. In FIGS. 14 and 16, the moving direction of the LED unit 130 according to the rotation is illustrated with arrows.

As described before, the LED unit 130 is rotatably mounted in the chassis 114 indirectly via the frame 118. Therefore, the LED unit 130 is not necessarily removed and separated from the chassis 114 completely for performing the operations such as replacement of the LEDs 131. Accordingly, the LED unit 130 is less likely to be lost. Further, the LED unit 130 is rotated with respect to the chassis 114 in a direction crossing the X-axis direction that is the extending direction of the light entrance edge surface 116b. Therefore, the rotation range of the LED unit 130 can be kept constant regardless of the arrangement area of the LEDs 131 with respect to the extending direction of the light entrance edge surface 116b. Therefore, an operation space required for the rotation of the LED unit 130 with respect to the chassis 114 is reduced and workability is improved.

Next, a holding mechanism of connecting the LED unit 130 to the chassis 114 will be described. As illustrated in FIG. 15, the unit body 134 of the LED unit 130 includes a stopper portion (stopper projection) 42 that can be elastically deformed (with warping), and the frame 118 fixed to the chassis 114 includes a stopping portion 25 (a stopper hole) which the stopper portion 32 is stopped by. The stopper portion 42 is integrally formed with the first side wall portion 40a overlapping the side wall portion 114b and the frame 18 on the outer side thereof and is elastically deformable (with warping) in the Y-axis direction. The stopper portion 42 has a stopper projection 42a projecting inward from an inner surface thereof and a releasing projection 42b projecting outward from an outer surface thereof. The stopper projection 42a is stopped by the stopping portion 25 and the releasing projection 42b is pulled from the outside such that the stopper portion 42 is forcibly warped. Thus, the stopping of the stopper projection 42a and the stopping portion 25 is released. The stopping portion 25 is a through hole that is through the portion of the frame 118 on the LED unit 130 side extending the X-axis direction and is through in the Y-axis direction. The stopper projection 42a is received in the stopping portion 25 and is stopped at an inner surface of the stopping portion 25 such that the unit body 134 is maintained in the mounted state. With such a holding mechanism having the above structure, the LED unit 130 can be maintained in the mounted state. Therefore, the holding of the LED unit 130 can be maintained more surely compared to a structure in that the holding of the LED unit 30 is maintained with a magnetic attraction force of the magnet units 36 as is in the first embodiment (see FIG. 7). When detaching the LED unit 130 from the chassis 114, the stopper portion 42 is elastically deformed (with warping) to easily release the stopper portion 42 from the stopping portion 25. Therefore, the workability of mounting and detaching is effectively ensured.

An operation of this embodiment having the above-described configuration will be described. First, in order to mount the LED unit 130 in the chassis 114, the rotation shaft 24 of the frame 118 is fit in the bearing recesses 41 while deforming and opening a pair of second side wall portions 40b of the unit body 134. Thus, the LED unit 130 is rotatably mounted in the chassis 114. The LED unit 130 is in the open state as illustrated in FIG. 16. The LED unit 130 that is in the open state is rotated with respect to the chassis 114 such that the stopper projection 42a of the stopper portion 42 is stopped on the inner surface of the stopping portion 25. Thus, as illustrated in FIGS. 14 and 15, the LED unit 130 is maintained in the mounted state.

The LED unit 130 that is mounted in the chassis 114 as described before is detached from the chassis 114 for maintenance or repair (such as replacement of the LED board 132). When the LED unit 130 that is in the mounted state illustrated in FIGS. 3 and 6 is detached from the chassis 114, the releasing projection 42b of the stopper portion 42 is pulled toward the outside in the Y-axis direction. Then, the stopper portion 42 is forced to be deformed elastically and the stopper projection 42a is moved out of the stopping portion 25 and stopper portion 42 is released from the stopping state. In the released state, the LED unit 130 is rotated and moved in the open state.

As described before, according to this embodiment, the chassis 114 includes at least the bottom portion 114a that supports an opposite plate surface 116c of the light guide plate 116 that is an opposite surface from a light exit plate surface 116a and the bottom portion 114a has the fitting hole 121. Thus, the bottom portion 114a of the chassis 114 has the fitting hole 121 through which the LEDs 131 are inserted and removed according to the mounting and detaching of the unit body 134. Therefore, even if light leaks through the fitting hole 121 of the chassis 114, the leaking light is less likely to be seen from the light exit side of the light guide plate 116 and light leaking is less likely to be recognized.

One of the unit body 134 and the chassis 114 includes the stopper portion 42 that is elastically deformable and another one of the unit body 134 and the chassis 114 includes the stopping portion 25 which the stopper portion 42 is stopped by. According to such a configuration, the elastically deformable stopper portion 42 is stopped by the stopping portion 25 such that the unit body 134 is held with the chassis 114. Therefore, holding of the unit body 134 can be maintained more surely than a configuration in that holding of the unit body 134 is maintained with magnets. When the unit body 134 is detached from the chassis 114, the stopper portion 42 is elastically deformed such that the stopping state of the stopper portion 42 and the stopping portion 25 can be released easily and workability of mounting and detaching of the unit body 134 is effectively ensured.

One of the unit body 134 and the chassis 114 includes the rotation shaft 24 and another one of the unit body 134 and the chassis 114 includes the bearing recesses 41 that pivotally supports the rotation shaft 24 such that the unit body 134 is rotatable with respect to the chassis 114. According to such a configuration, the unit body 134 is rotated with respect to the chassis 114 such that the LEDs 131 included in the unit body 134 are inserted in and removed from the fitting hole 121 of the chassis 114. The rotation shaft 24 is pivotally supported by the bearing recesses 41 such that the unit body 134 is rotatable with respect to the chassis 114. Therefore, the operation such as replacement of the LEDs 131 can be performed without detaching the unit body 134 completely from the chassis 114. Therefore, the unit body 134 is less likely to be lost.

The axial direction of the rotation shaft 24 is parallel to the extending direction. According to such a configuration, the unit body 134 is rotated in the direction crossing the extending direction of the light entrance edge surface 116*b* with respect to the chassis 114. Therefore, the rotation range of the unit body 134 can be kept constant regardless of the arrangement area of the LEDs 131 with respect to the extending direction of the light entrance edge surface 116*b*. Therefore, an operation space required for the rotation of the unit body 134 with respect to the chassis 114 is reduced and workability is further improved.

Other Embodiments

The present invention is not limited to the embodiments, which have been described using the foregoing descriptions and the drawings. For example, embodiments described below are also included in the technical scope of the present invention.

(1) The first embodiment may be modified as follows. In the structure that the fitting hole opens in a direction of the normal line to the light entrance edge surface, the LED unit may be rotatably mounted in the chassis via the rotation mechanism as described in the second embodiment.

(2) In the first embodiment, in the configuration that the fitting hole opens in the direction of the normal line to the light entrance edge surface, the LED unit is connected to the chassis with the magnet units and maintained in the mounted state. However, the holding mechanism including the stopper portion and the stopping portion as described in the second embodiment may be used in the configuration that the fitting hole opens in the direction of the normal line to the light entrance edge surface.

(3) In the first embodiment, the positioning structure is relatively near the LEDs and the holding mechanism (the magnet units) is relatively far away from the LEDs. However, the holding mechanism (the magnet units) may be relatively near the LEDs and the positioning structure may be relatively far away from the LEDs.

(4) In the first embodiment, the chassis is made of magnetic material as a whole. However, in the chassis, at least the LED side wall portion that is directly in contact with the magnet units may be made of magnetic material such that a holding force (attraction force) of the magnet unit can be achieved. Therefore, the chassis may be partially made of magnetic material.

(5) In the holding mechanism according to the first embodiment, the magnet units included in the unit body is attached to the LED side wall portion of the chassis that is made of magnetic material. However, the magnet units may be included in the chassis and a portion made of magnetic material (sticking portion) that is to be attracted by the magnet units may be included in the unit body.

(6) In the first embodiment, the unit body includes the positioning projections and the chassis includes the positioning holes. The chassis may include the positioning projections and the unit body may include the positioning holes. In such a configuration, a projected dimension of the positioning projections from the chassis is preferably greater than that of the LEDs from the LED board.

(7) In the first embodiment, the positioning holes are through the LED side wall portion of the chassis. However, the positioning holes may not be through the LED side wall portion of the chassis but may be recessed holes.

(8) In the first embodiment, the panel holding member includes the backlight receiving portion. However, the panel holding member may not include the backlight receiving portion as is in the second embodiment.

(9) The second embodiment may be modified as follows. In the configuration that the fitting hole opens in the direction perpendicular to the direction of the normal line to the light entrance edge surface and the extending direction of the light entrance edge surface, the LED unit may be mounted in and detached from the chassis straightly along the direction in which the fitting hole opens.

(10) In the second embodiment, in the configuration that the fitting hole opens in a direction perpendicular to the direction of the normal line to the light entrance edge surface and the extending direction of the light entrance edge surface, the holding mechanism includes the stopper portions and the stopping portions. However, in the configuration that the fitting hole opens in a direction perpendicular to the direction of the normal line to the light entrance edge surface and the extending direction of the light entrance edge surface, the LED unit may be mounted in the chassis with the magnet units and the mounted state may be maintained with the magnet units as is described in the first embodiment.

(11) In the second embodiment, the rotation shaft of the rotation mechanism is mounted on the frame that is fixed to the chassis. However, the rotation shaft may be directly mounted on the chassis.

(12) In the second embodiment, the rotation shaft is included in the frame (on the chassis side) and the bearing recesses are included in the unit body (on the LED unit side). However, the rotary shaft may be included in the unit body (on the LED unit side) and the bearing recesses may be included in the frame (on the chassis side).

(13) In the second embodiment, the axial direction of the rotation shaft included in the rotation mechanism matches the extending direction of the light entrance edge surface. The rotation shaft may be arranged such that the axial direction of the rotation shaft matches a direction of the normal line to the light entrance edge surface or the axial direction of the rotation shaft matches a direction perpendicular to the direction of the normal line to the light entrance edge surface and the extending direction of the light entrance edge surface.

(14) The second embodiment may be modified to include the positioning mechanism as described in the first embodiment.

(15) In the second embodiment, the bearing recesses of the rotation mechanism are through the second side wall portion. However, the bearing recesses may not be through the second side wall portion but may be recessed holes.

(16) The dustproof sheet described in the second embodiment preferably has light blocking properties. However, the dustproof sheet may not have light blocking properties but may have light transmissivity.

(17) In the second embodiment, the panel holding member does not include the backlight receiving portion but may include the panel receiving portion as is in the first embodiment.

(18) In each of the above embodiments, the backlight device is a one-side light entering type backlight device in which one of the long-side edge surfaces of the light guide plate is the light entrance edge surface. However, the present invention may be applied to a backlight device of a one-side light entering type in which one of short-side edge surfaces of a light guide plate is a light entrance edge surface. In such a configuration, the LED unit may be arranged on the one short-side edge surface side of the backlight device.

(19) Other than the configuration (18), the present invention may be applied to the backlight device of a two-sides light entering type in which a pair of long-side edge surfaces or a pair of short-side edge surfaces of the light guide plate are light entrance edge surfaces. The present invention may be also applied to the backlight device of a three-sides light entering type in which any three edge surfaces of peripheral edge surfaces of the light guide plate are the light entrance edge surfaces. The present invention may be also applied to the backlight device of a four-sides light entering type in which all of the four edge surfaces of peripheral edge surfaces of the light guide plate are the light entrance edge surfaces. In any one of the above configurations, the number of the LED units may be changed to two to four.

(20) In each of the above embodiments, the chassis is made of metal. However, the chassis may be made of synthetic resin.

(21) In each of the above embodiments, the LEDs are used as the light source. However, other light sources such as an organic EL may be used.

(22) In each of the above embodiments, the TFTs are used as switching components of the liquid crystal display device. However, switching components other than the TFTs (such as thin film diodes (TFDs)) may be included in the scope of the present invention. Furthermore, a liquid crystal display device configured to display black and white images other than the liquid crystal display device configured to display color images.

(23) In each of the above embodiments, the transmissive-type liquid crystal display device is described. However, a reflection-type liquid crystal display device and a semi-transmissive type liquid crystal display device may be included in the scope of the present invention.

(24) In each of the above embodiments, the liquid crystal display device including the liquid crystal panel as the display panel is used. The present invention may be applied to display devices including other type of display panel.

EXPLANATION OF SYMBOLS

10: liquid crystal display device (display device), 11, 111: liquid crystal panel (display panel), 12: backlight device (lighting device), 14, 114: chassis, 14a, 114a: bottom portion, 14b, 114b: side wall portion, 16, 116: light guide plate, 16a 116a: light exit plate surface, 16b, 116b: light entrance edge surface, 16c, 116c: opposite plate surface (plate surface on an opposite side), 19: LED side wall portion (side portion, magnetic member), 19a: positioning hole, 21, 121: fitting hole, 23: light transmissive dustproof sheet (light transmissive dustproof member), 24: rotation shaft, 25: stopping portion, 31, 131: LED (light source), 34, 134: unit body (light source holding member), 34d: positioning projection, 36a: magnet, 41: bearing recess, 42: stopper portion

The invention claimed is:

1. A lighting device comprising:
   a light source;
   a light source holding member holding the light source;
   a light guide plate having a light entrance edge surface and a light exit plate surface, the light entrance edge surface being a part of outer peripheral edge surfaces of the light guide plate and extending in a peripheral direction and through which light from the light source enters, and the light exit plate surface being one of a pair of plate surfaces of the light guide plate and through which light exits; and
   a casing in which the light source and the light guide plate are arranged and the light source holding member is detachably mounted, the casing having a hole that is open in a direction crossing an extending direction in which the light entrance edge surface extends such that the light source is inserted in and removed from the hole according to mounting and detaching of the light source holding member, wherein
   the casing includes at least a bottom portion that supports a plate surface of the light guide plate opposite from the light exit plate surface and the bottom portion has the hole.

2. The lighting device according to claim 1, wherein the casing includes at least a side wall portion that is opposite the light entrance edge surface of the light guide plate, and the side wall portion has the hole.

3. The lighting device according to claim 1, wherein one of the light source holding member and the casing includes a magnetic portion, and another one of the light source holding member and the casing includes a magnet on at least a part thereof, the magnet being attached to the magnetic portion.

4. A display device comprising:
   the lighting device according to claim 1; and
   a display panel displaying images using light from the lighting device.

5. The lighting device according to claim 2, further comprising a light transmissive dustproof member that is disposed to cover the hole of the casing and through which the light from the light source passes.

6. The lighting device according to claim 3, wherein the magnet is arranged next to the light source and on an outer side with respect to the light source in the extending direction.

7. The lighting device according to claim 3, wherein
   one of the light source holding member and the casing includes a positioning projection that projects toward another one of the light source holding member and the casing in a direction of a normal line to the light entrance edge surface, and the other one of the light source holding member and the casing includes a positioning hole that receives the positioning projection.

8. The lighting device according to claim 7, wherein the light source holding member includes the positioning projection and the positioning projection has a projected distal end that projects further than the light source.

9. A lighting device comprising:
a light source;
a light source holding member holding the light source;
a light guide plate having a light entrance edge surface and a light exit plate surface, the light entrance edge surface being a part of outer peripheral edge surfaces of the light guide plate and extending in a peripheral direction and through which light from the light source enters, and the light exit plate surface being one of a pair of plate surfaces of the light guide plate and through which light exits; and
a casing in which the light source and the light guide plate are arranged and the light source holding member is detachably mounted, the casing having a hole that is open in a direction crossing an extending direction in which the light entrance edge surface extends such that the light source is inserted in and removed from the hole according to mounting and detaching of the light source holding member, wherein
one of the light source holding member and the casing includes a stopper portion that is deformable with warping, and
another one of the light source holding member and the casing includes a stopping portion which the stopper portion is stopped by.

10. A lighting device comprising:
a light source;
a light source holding member holding the light source;
a light guide plate having a light entrance edge surface and a light exit plate surface, the light entrance edge surface being a part of outer peripheral edge surfaces of the light guide plate and extending in a peripheral direction and through which light from the light source enters, and the light exit plate surface being one of a pair of plate surfaces of the light guide plate and through which light exits; and
a casing in which the light source and the light guide plate are arranged and the light source holding member is detachably mounted, the casing having a hole that is open in a direction crossing an extending direction in which the light entrance edge surface extends such that the light source is inserted in and removed from the hole according to mounting and detaching of the light source holding member, wherein
one of the light source holding member and the casing includes a rotation shaft, and
another one of the light source holding member and the casing includes a bearing recess portion.

11. The lighting device according to claim 10, wherein the rotation shaft has a rotation axis that is parallel to the extending direction.

* * * * *